United States Patent [19]
Takanori et al.

[11] Patent Number: 5,301,248
[45] Date of Patent: Apr. 5, 1994

[54] METHOD FOR PATTERN INSPECTION AND APPARATUS THEREFOR

[75] Inventors: Ninomiya Takanori; Kazushi Yoshimura; Mineo Nomoto, all of Yokohama, Japan

[73] Assignee: Hitachi, Ltd., Tokyo, Japan

[21] Appl. No.: 904,892

[22] Filed: Jun. 25, 1992

Related U.S. Application Data

[63] Continuation of Ser. No. 267,554, Nov. 4, 1988, abandoned.

[30] Foreign Application Priority Data

| Nov. 9, 1987 | [JP] | Japan | 62-280920 |
| Nov. 30, 1987 | [JP] | Japan | 62-300282 |
| Apr. 15, 1988 | [JP] | Japan | 63-91309 |
| Jun. 29, 1988 | [JP] | Japan | 63-159103 |
| Jul. 19, 1988 | [JP] | Japan | 63-178234 |

[51] Int. Cl.$^5$ ............................................. G06K 9/00
[52] U.S. Cl. ............................................. 382/8; 382/55; 382/47; 348/126
[58] Field of Search ............ 382/8, 55, 41, 49, 47; 371/24, 27; 356/388, 392, 394; 358/101, 106, 107

[56] References Cited

U.S. PATENT DOCUMENTS

| 4,654,583 | 3/1987 | Ninomiya et al. | 324/73 |
| 4,853,967 | 8/1989 | Maudeville | 382/49 |
| 4,872,064 | 10/1989 | Tutt et al. | 358/464 |
| 4,922,308 | 5/1990 | Noguchi et al. | 356/237 |

FOREIGN PATENT DOCUMENTS 59-192945 4/1983 Japan.
61-80376 9/1984 Japan.

OTHER PUBLICATIONS

Tamura, "Further Considerations on Line Thinning Schemes" Report of the Technical Committee of the Association of Electronic Communication PRL 75-66.

Primary Examiner—Joseph Mancuso
Assistant Examiner—Jon Chang
Attorney, Agent, or Firm—Kenyon & Kenyon

[57] ABSTRACT

A detected pattern is binarized, the binarized pattern is expanded, an image size is reduced while a connectivity of the expanded pattern is preserved and stored in a first memory. In turn, the binarized pattern is contracted, the image size is reduced while a connectivity of the contracted pattern is preserved and stored in a second memory. Then the expanded pattern is read out from the first memory and a connectivity of the pattern is selected. The contracted pattern is read out from the second pattern and the connectivity of the pattern is extracted. The selected connectivities are compared with the connectivity of a normal pattern to detect a non-coincidence. The circuit pattern having a short circuit or a semi-short circuit defect and a circuit pattern having an open circuit or a semi-open circuit defect are classified and selected in response to these non-coincidences. Further, a pattern shape stored in the first memory is analyzed to specify the position where the short circuit or a semi-short circuit defect is present.

39 Claims, 33 Drawing Sheets

FIG. 6
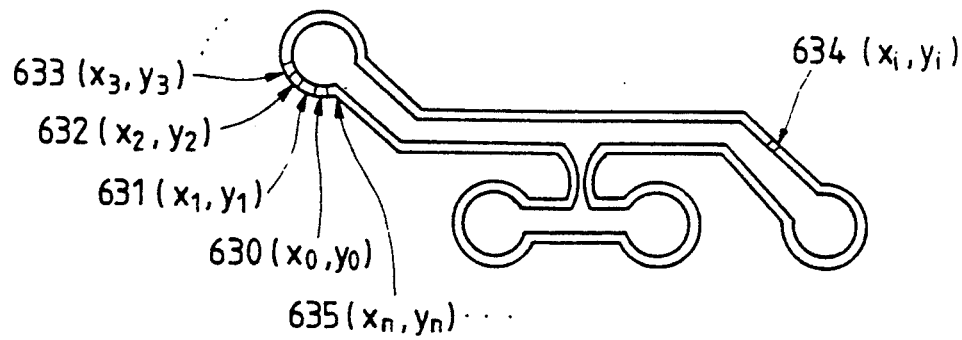
$(x_0, y_0) - (x_1, y_1) - (x_2, y_2) - (x_3, y_3) - \cdots$
$\cdots - (x_i, y_i) - \cdots - (x_n, y_n)$
640 DIVISION OF EDGE COORDINATE SEQUENCE
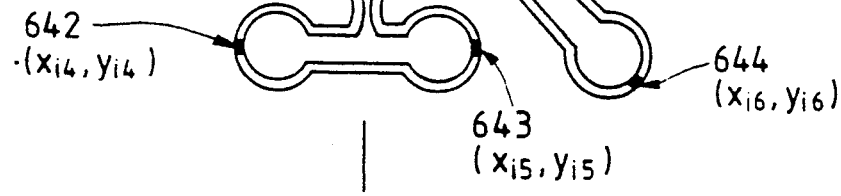
650 · SELECTION OF ILLEGAL EDGE COORDINATE SEQUENCE
651 · EXTRACTION OF A PAIR OF COORDINATES WITH MINIMUM DISTANCE
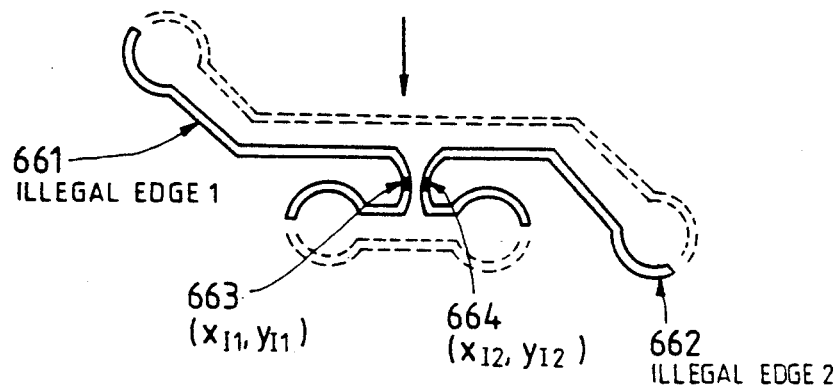
660 POSITION OF SHORT DEFECT

FIG. 7
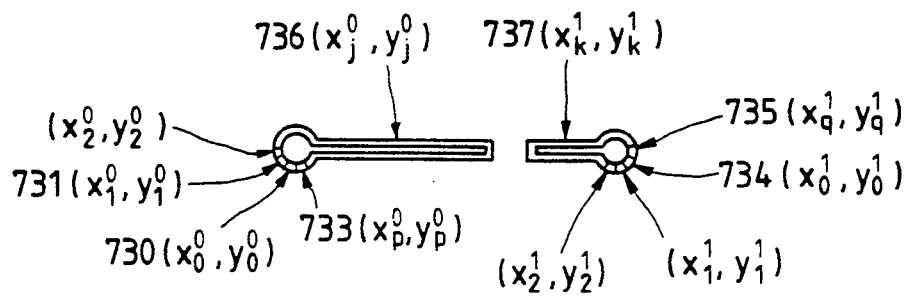
$$\begin{cases} (x_0^0, y_0^0) - (x_1^0, y_1^0) - (x_2^0, y_2^0) - \cdots - (x_j^0, y_j^0) - \cdots - (x_p^0, y_p^0) \\ (x_0^1, y_0^1) - (x_1^1, y_1^1) - (x_2^1, y_2^1) - \cdots - (x_k^1, y_k^1) - \cdots - (x_q^0, y_q^0) \end{cases}$$
740 EXTRACTION OF A PAIR OF COORDINATE WITH MINIMUM DISTANCE
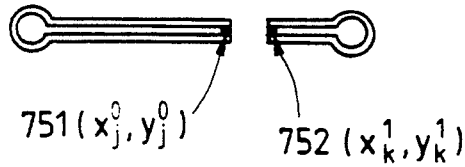
750 POSITION OF OPEN DEFECT

FIG. 11(a)  FIG. 11(b)  FIG. 11(c)  FIG. 11(d)
M1    M2    M3    M4
FIG. 12
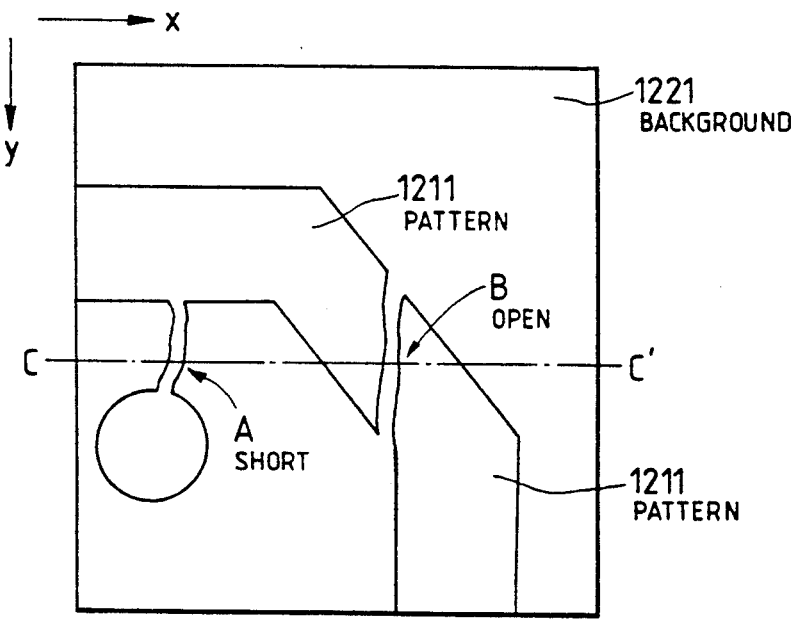
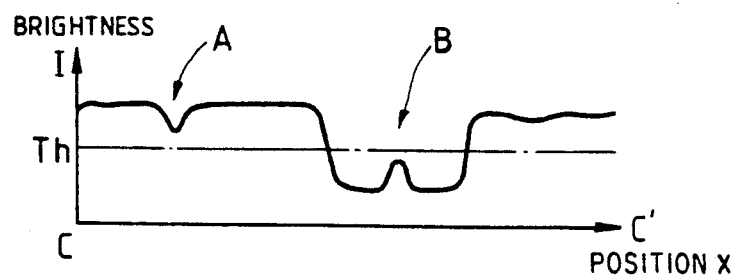

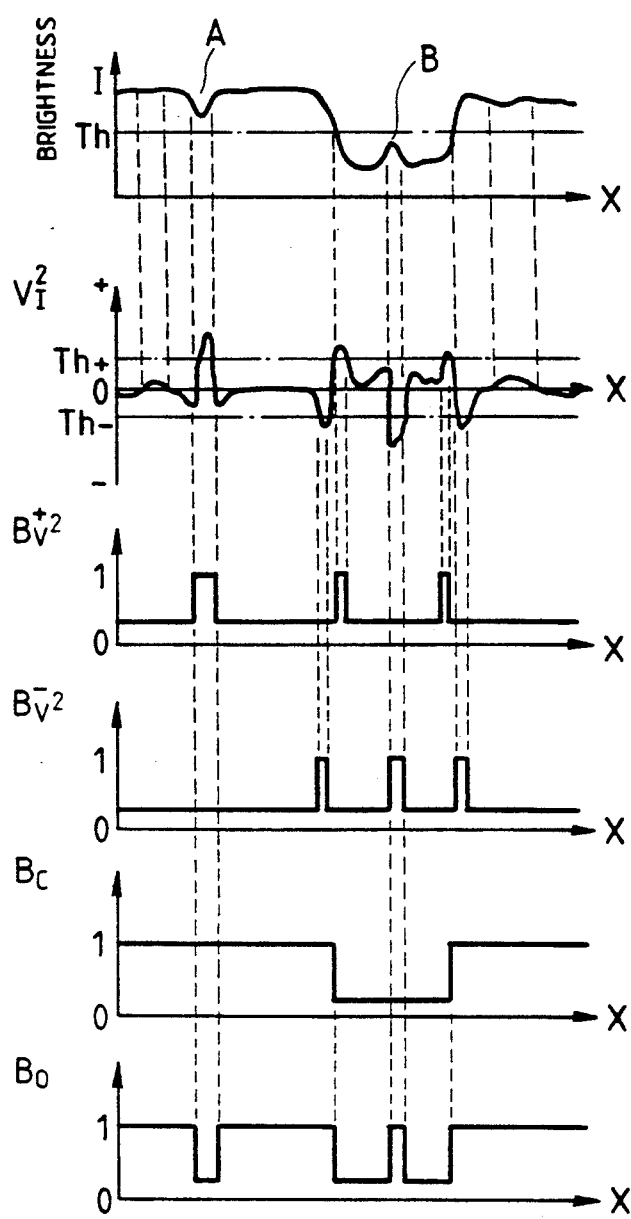
FIG. 14
FIG. 15
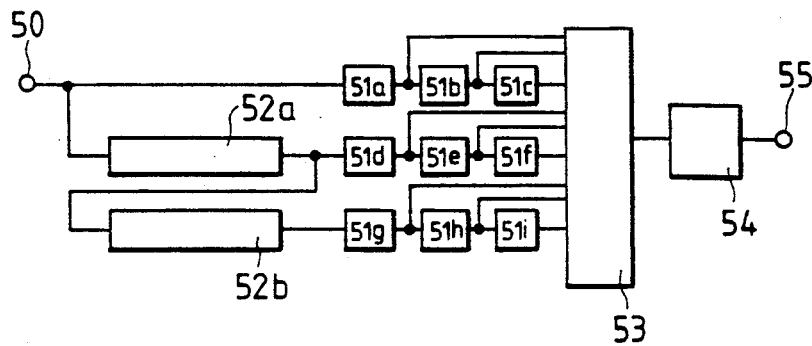

FIG. 19
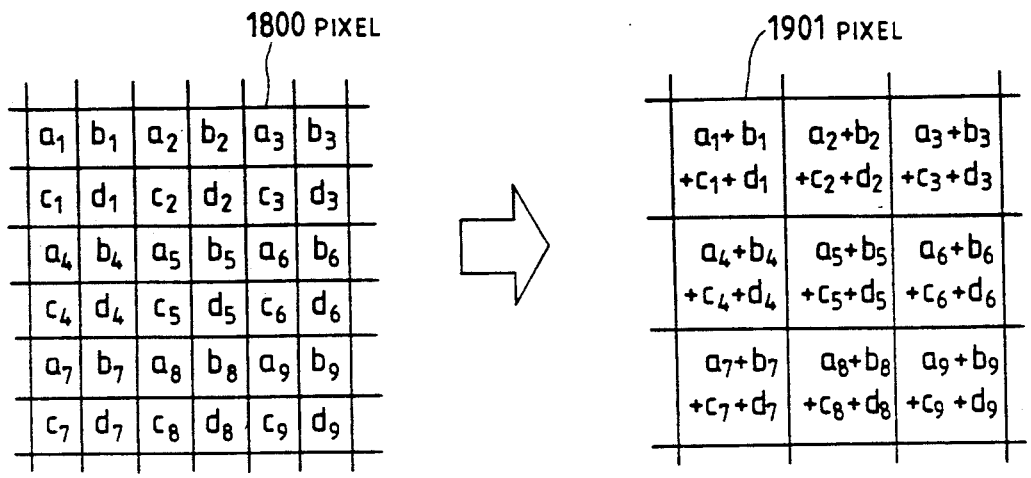
FIG. 20(a)     FIG. 20(b)
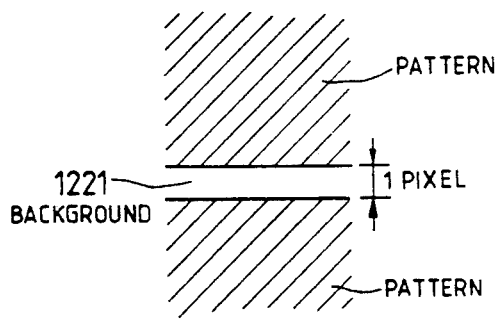 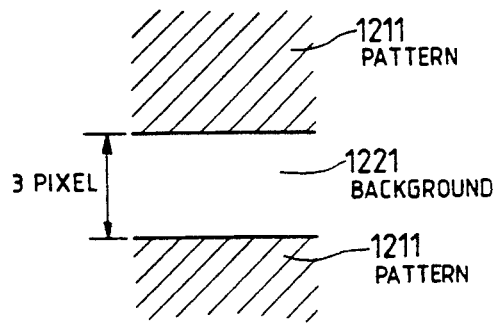
FIG. 21(a)   FIG. 21(b)   FIG. 21(c)
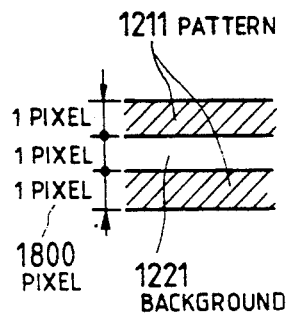 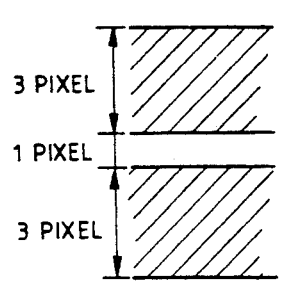 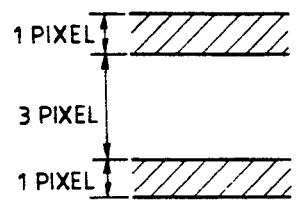

FIG. 27

| X | 0 | X |
|---|---|---|
| 0 | 0 | 1 |
| X | 1 | 1 |

| X | 1 | 1 |
|---|---|---|
| 0 | 0 | 1 |
| X | 0 | X |

| X | 0 | X |
|---|---|---|
| 0 | 0 | 1 |
| X | 0 | X |

| 0 | 1 | 1 |
|---|---|---|
| 1 | 0 | 1 |
| 1 | 1 | 1 |

| 1 | 1 | 1 |
|---|---|---|
| 1 | 0 | 1 |
| 0 | 1 | 1 |

| X | 1 | 1 |
|---|---|---|
| 0 | 0 | 1 |
| X | 1 | 1 |

OUTPUT=1

FIG. 29

| 1 | 1 | X |
|---|---|---|
| 1 | 0 | 0 |
| X | 0 | X |

| X | 0 | X |
|---|---|---|
| 1 | 0 | 0 |
| 1 | 1 | X |

| X | 0 | X |
|---|---|---|
| 1 | 0 | 0 |
| X | 0 | X |

| 1 | 1 | 1 |
|---|---|---|
| 1 | 0 | 1 |
| 1 | 1 | 0 |

| 1 | 1 | 0 |
|---|---|---|
| 1 | 0 | 1 |
| 1 | 1 | 1 |

| 1 | 1 | X |
|---|---|---|
| 1 | 0 | 0 |
| 1 | 1 | X |

OUTPUT=1

FIG. 28

| X | 1 | 1 |
|---|---|---|
| 0 | 0 | 1 |
| X | 0 | X |

| 1 | 1 | X |
|---|---|---|
| 1 | 0 | 0 |
| X | 0 | X |

| X | 1 | X |
|---|---|---|
| 0 | 0 | 0 |
| X | 0 | X |

| 1 | 1 | 1 |
|---|---|---|
| 1 | 0 | 1 |
| 0 | 1 | 1 |

| 1 | 1 | 1 |
|---|---|---|
| 1 | 0 | 1 |
| 1 | 1 | 0 |

| 1 | 1 | 1 |
|---|---|---|
| 1 | 0 | 1 |
| X | 0 | X |

OUTPUT=1

FIG. 30

| X | 0 | X |
|---|---|---|
| 1 | 0 | 0 |
| 1 | 1 | X |

| X | 0 | X |
|---|---|---|
| 0 | 0 | 1 |
| X | 1 | 1 |

| X | 0 | X |
|---|---|---|
| 0 | 0 | 0 |
| X | 1 | X |

| 1 | 1 | 0 |
|---|---|---|
| 1 | 0 | 1 |
| 1 | 1 | 1 |

| 0 | 1 | 1 |
|---|---|---|
| 1 | 0 | 1 |
| 1 | 1 | 1 |

| X | 0 | X |
|---|---|---|
| 1 | 0 | 1 |
| 1 | 1 | 1 |

OUTPUT=1

FIG. 31

| X | 0 | X |
|---|---|---|
| 1 | 1 | 0 |
| 1 | 1 | X |

| X | 0 | X |
|---|---|---|
| 0 | 1 | 1 |
| X | 1 | 1 |

} OUTPUT=0 {

| X | 0 | X |
|---|---|---|
| 1 | 1 | 1 |
| 1 | 1 | 1 |

| X | 0 | X |
|---|---|---|
| 0 | 1 | 0 |
| X | 1 | X |

FIG. 32

| 1 | 1 | X |
|---|---|---|
| 1 | 1 | 0 |
| X | 0 | X |

| X | 0 | X |
|---|---|---|
| 1 | 1 | 0 |
| 1 | 1 | X |

} OUTPUT=0 {

| 1 | 1 | X |
|---|---|---|
| 1 | 1 | 0 |
| 1 | 1 | X |

| X | 0 | X |
|---|---|---|
| 1 | 1 | 0 |
| X | 0 | X |

FIG. 33

| X | 1 | 1 |
|---|---|---|
| 0 | 1 | 1 |
| X | 0 | X |

| 1 | 1 | X |
|---|---|---|
| 1 | 1 | 0 |
| X | 0 | X |

} OUTPUT=0 {

| 1 | 1 | 1 |
|---|---|---|
| 1 | 1 | 1 |
| X | 0 | X |

| X | 1 | X |
|---|---|---|
| 0 | 1 | 0 |
| X | 0 | X |

FIG. 34

| X | 0 | X |
|---|---|---|
| 0 | 1 | 1 |
| X | 1 | 1 |

| X | 1 | 1 |
|---|---|---|
| 0 | 1 | 1 |
| X | 1 | 1 |

} OUTPUT=0 {

| X | 1 | 1 |
|---|---|---|
| 0 | 1 | 1 |
| X | 0 | X |

| X | 0 | X |
|---|---|---|
| 0 | 1 | 1 |
| X | 0 | X |

1 : 1 PIXEL OF PATTERN
0 : 1 PIXEL OF BACKGROUND
(COMMON TO FIG. 35(a)~FIG. 35(m))

[1] : 1 PIXEL OF PATTERN
[0] : 1 PIXEL OF BACKGROUND

FIG. 37

$\left.\begin{array}{c}\begin{array}{|c|c|c|}\hline X & 0 & X \\\hline 0 & 1 & 0 \\\hline X & 1 & X \\\hline\end{array}\\\\\begin{array}{|c|c|c|}\hline X & 0 & X \\\hline 1 & 1 & 0 \\\hline X & 0 & X \\\hline\end{array}\\\\\begin{array}{|c|c|c|}\hline X & 0 & X \\\hline 0 & 1 & 0 \\\hline X & 0 & X \\\hline\end{array}\end{array}\right\}$ OUTPUT = 0

FIG. 38

$\left.\begin{array}{c}\begin{array}{|c|c|c|}\hline X & 1 & X \\\hline 0 & 1 & 0 \\\hline X & 0 & X \\\hline\end{array}\\\\\begin{array}{|c|c|c|}\hline X & 0 & X \\\hline 0 & 1 & 1 \\\hline X & 0 & X \\\hline\end{array}\\\\\begin{array}{|c|c|c|}\hline X & 0 & X \\\hline 0 & 1 & 0 \\\hline X & 0 & X \\\hline\end{array}\end{array}\right\}$ OUTPUT = 0

FIG. 39

$\left.\begin{array}{c}\begin{array}{|c|c|c|}\hline 0 & 1 & 1 \\\hline 1 & 0 & 1 \\\hline 1 & 1 & 1 \\\hline\end{array}\\\\\begin{array}{|c|c|c|}\hline 1 & 1 & 1 \\\hline 1 & 0 & 1 \\\hline 0 & 1 & 1 \\\hline\end{array}\\\\\begin{array}{|c|c|c|}\hline X & 1 & 1 \\\hline 0 & 0 & 1 \\\hline X & 1 & 1 \\\hline\end{array}\end{array}\right\}$ OUTPUT = 1

$\begin{array}{|c|c|c|}\hline 1 & 1 & 1 \\\hline 1 & 0 & 1 \\\hline 1 & 1 & 1 \\\hline\end{array}$ $\begin{array}{|c|c|c|}\hline 1 & 1 & 1 \\\hline 1 & 0 & 1 \\\hline 1 & 1 & 0 \\\hline\end{array}$ $\begin{array}{|c|c|c|}\hline 1 & 1 & 1 \\\hline 1 & 0 & 1 \\\hline X & 0 & X \\\hline\end{array}$

FIG. 40

$\left.\begin{array}{c}\begin{array}{|c|c|c|}\hline 1 & 1 & 1 \\\hline 1 & 0 & 1 \\\hline 1 & 1 & 0 \\\hline\end{array}\\\\\begin{array}{|c|c|c|}\hline 1 & 1 & 0 \\\hline 1 & 0 & 1 \\\hline 1 & 1 & 1 \\\hline\end{array}\\\\\begin{array}{|c|c|c|}\hline 1 & 1 & X \\\hline 1 & 0 & 0 \\\hline 1 & 1 & X \\\hline\end{array}\end{array}\right\}$ OUTPUT = 1

$\begin{array}{|c|c|c|}\hline 1 & 1 & 1 \\\hline 1 & 0 & 1 \\\hline 1 & 1 & 1 \\\hline\end{array}$ $\begin{array}{|c|c|c|}\hline 0 & 1 & 1 \\\hline 1 & 0 & 1 \\\hline 1 & 1 & 1 \\\hline\end{array}$ $\begin{array}{|c|c|c|}\hline X & 0 & X \\\hline 1 & 0 & 1 \\\hline 1 & 1 & 1 \\\hline\end{array}$

FIG. 41
ADDRESS : DATA
| PAD No. | PAD No. |
|---|---|
| 1 | 1 |
| 2 | 2 |
| 3 | 2 |
| 4 | 1 |
| 5 | 1 |
| 6 | 1 |
FIG. 42
ADDRESS : DATA
| PAD No. | PAD No. |
|---|---|
| 1 | 6 |
| 2 | 3 |
| 3 | 2 |
| 4 | 5 |
| 5 | 4 |
| 6 | 1 |
FIG. 43
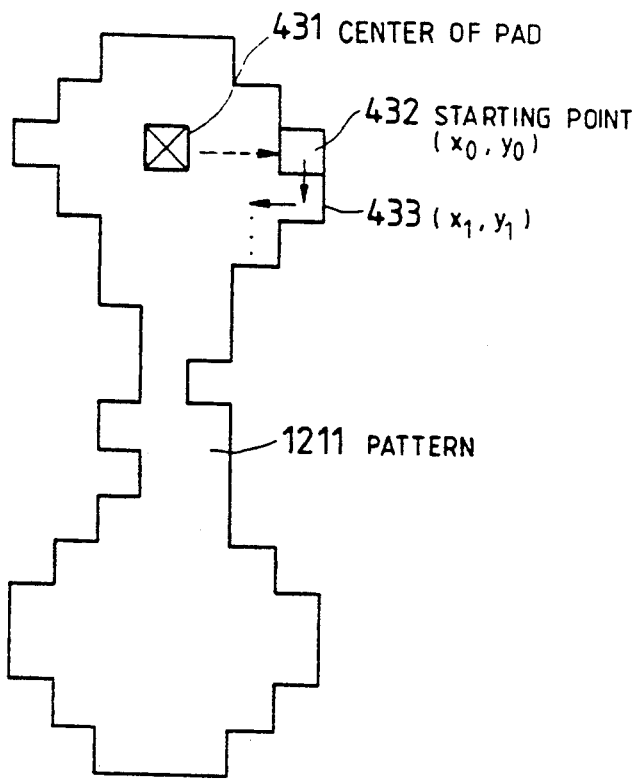
431 CENTER OF PAD
432 STARTING POINT $(x_0, y_0)$
433 $(x_1, y_1)$
1211 PATTERN
FIG. 44
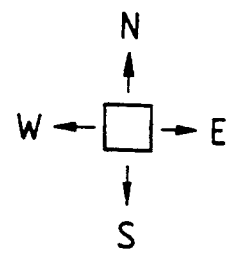

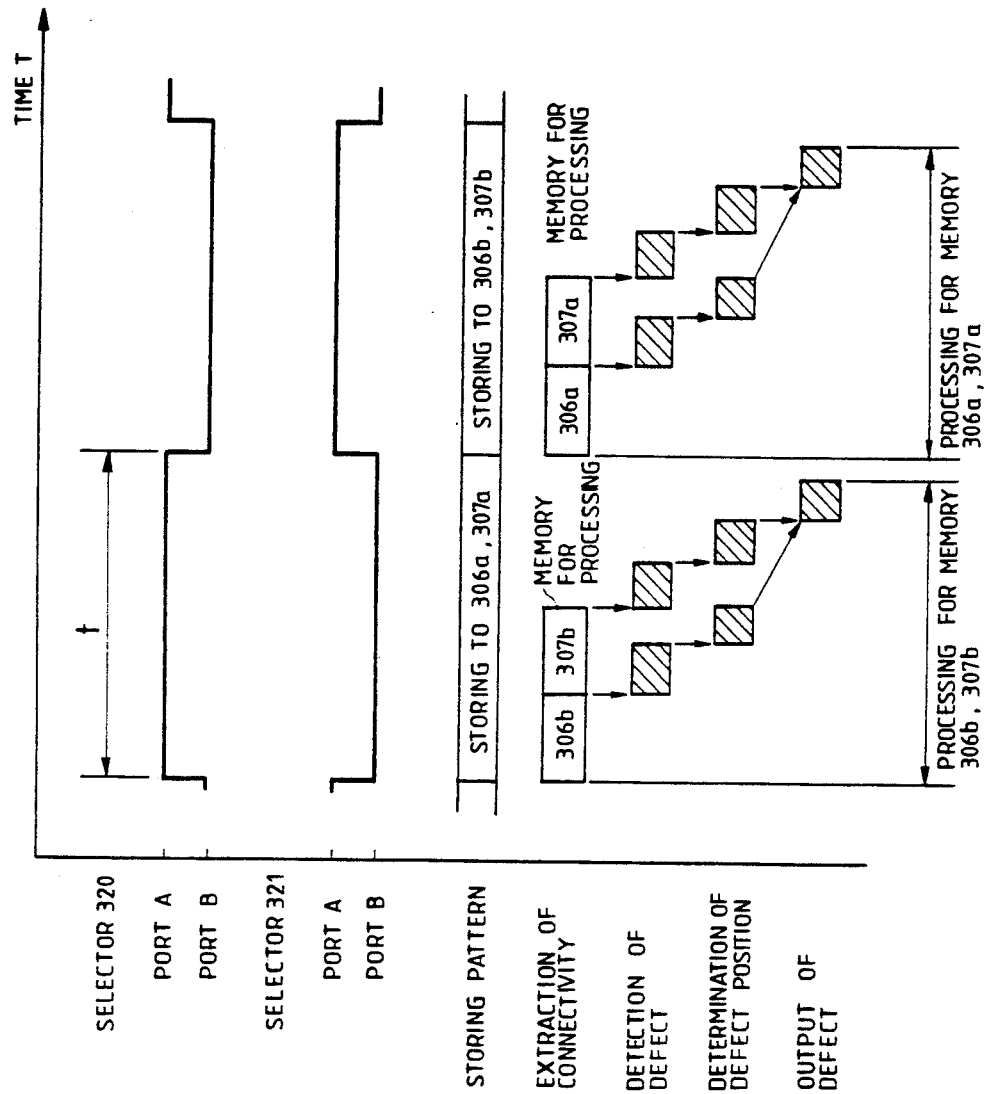

FIG. 53
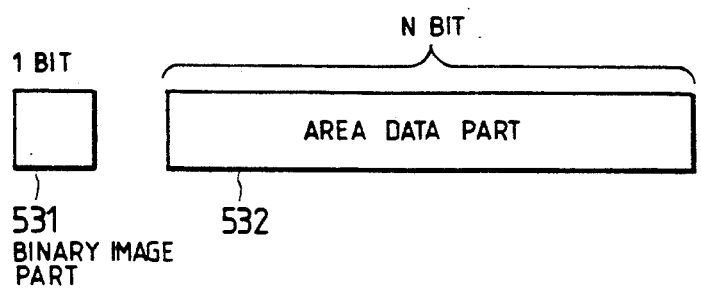
531 BINARY IMAGE PART
532
FIG. 54
(a) INITIAL VALUE
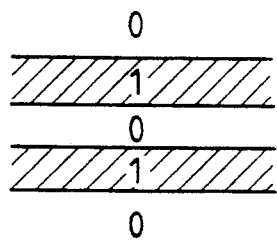
(b) (STEP 1)
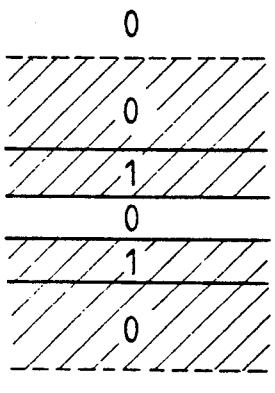
(c) (STEP 2')
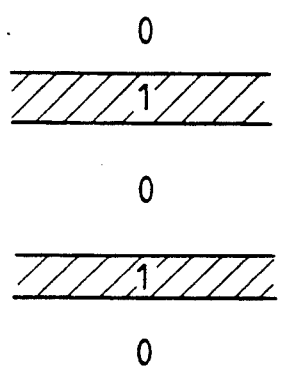
(d) (STEP 3')
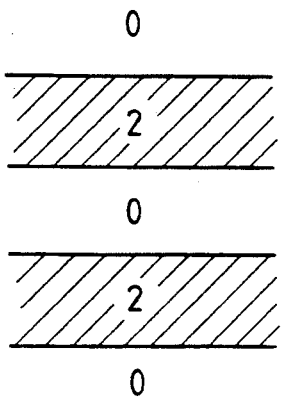
☐ : A PIXEL FOR (a)-(c)
☐ : A PIXEL FOR (d)
▨ : 1 FOR BINARY IMAGE PART (NOT HATCHED : 0)

METHOD FOR PATTERN INSPECTION AND APPARATUS THEREFOR

This application is a continuation of application Ser. No. 07/267,554 filed on Nov. 4, 1988, now abandoned.

BACKGROUND OF THE INVENTION

1. Field of the Invention

This invention relates to an outer appearance inspection of a printed circuit pattern, and more particularly a pattern inspection method and an apparatus therefor which is suitable for allowing a specified amount of unevenesses in case that a pattern has certain expected unevenesses in its contour and for making a positive inspection of only a detrimental defect.

2. Description of the Related Art

As an example, a circuit pattern drawn in a ceramic green sheet has, as shown in FIG. 2, several unevenesses (a) at its pattern edges. Since the unevenesses (a) of the pattern edges are not a circuit pattern defect, it is necessary not to make an erroneous identification of the unevenesses (a) as defects like unevennesses (b) to (e) which are original detrimental defects (open (circuit) b, semi-open (circuit) c, short (circuit) d, and semi-short (circuit) e) are to be inspected.

In case that the above-described circuit pattern is to be inspected, as described in the conventional system of U.S. Pat. No. 4,654,583, the inspected pattern is binarized and this binarized pattern is expanded and contracted by a specified amount. Thereafter a connectivity of patterns between the specified positions is compared with a good product data or a design data so as to inspect for defects.

In the case of the above-described patent, a presence or a non-presence of the defect can be inspected more or accurately even in case that the pattern edges have some unevenesses. However, since the presence or non-presence of the defect is inspected as a unit of one connected pattern, it is not possible to specify a location of the defect in the pattern and this specifying operation is not considered.

However, the circuit pattern sheet made in recent years is made large in size and it shows a trend to cause a length of one pattern to be elongated. Thus, even if the presence of absence of a defect can be detected, the prior art shows a problem that it takes much time to make a visual confirmation of the defect location of the pattern judged as having a defect, unless the specifying of the position of the defect in the circuit pattern can be performed. Much is consumed until the defect in the pattern is corrected.

In the known system, it is necessary to perform an extraction of connectivity of pattern in synchronism with an inspection of pattern in real time when a high speed inspection is to be performed. In general, since this process is troublesome, as disclosed in Jap. Patent Laid-Open No. 61-80376, the processing unit is complicated. Thus, the inspection device for realizing the high speed operation of the above-described system has a problem that it requires a high speed electric circuit having a large size and it is expensive in cost.

SUMMARY OF THE INVENTION

It is an object of the present invention to provide a pattern inspection method and an inspection apparatus in which not only the presence or absence of a defect can be detected, but also a defect's position can be inspected more accurately from the circuit pattern having several unevenesses at the edge part and a high speed inspection can easily be realized. In view of this fact, the present invention has a feature that an image pattern of an inspected item is detected and converted into an electrical signal. This pattern signal of the detector circuit is converted into a binarized image signal. The circuit pattern of the binarized image signal is expanded or contracted and the number of pixels constituting the expanded or contracted pattern is decreased. The image size is thereby reduced while keeping the connectivity of the circuit pattern. The connectivity of the circuit pattern is contracted in reference to the contracted circuit pattern, the contracted connectivity is compared with the connectivity of a reference circuit pattern and then a non-coincidence between them is detected so as to detect the presence or absence of the defect above.

In addition, the present invention is characterized in that an image pattern of the detected item is detected and converted into an electrical signal. This detection circuit pattern signal is converted into a binarized image signal. The circuit pattern of the binarized image signal is expanded or contracted. A connectivity of the expanded or contracted pattern is selected. The selected connectivity is compared with a connectivity of a reference circuit pattern and a non-coincidence between them is thereby detected. A coordinate sequence expressing a circuit pattern shape is analyzed in respect to the circuit pattern of which non-coincidence is detected to specify the position of the defect of the circuit pattern.

An action of the present invention will be schematically described.

A semi-short (circuit) is converted into a short (circuit) by expanding the binarized pattern and a semi-open (circuit) is converted into an open (circuit) by contracting the binarized pattern. Since the connectivity between pads of pattern where the short (circuit) or an open (circuit) defect is present is different from that of a normal one, a connectivity of the expanded pattern is extracted and compared with a normal connectivity. The short (circuit), a semi-short (circuit) and a large open (circuit) may extract a connectivity of the contracted pattern and this is compared with the normal connectivity. The open (circuit), a semi-open (circuit) and a large short (circuit) can thereby be detected. Since these processings are noted only for the connectivity of the pattern, the above-described defect can be detected without being influenced by small unevenesses at the pattern edges. A final object of the above-described processing consists in a selection and a comparison of the connectivity of the pattern, so that in the method of the present invention, the expanded or contracted pattern is contracted (pixels of n×n are converted into one pixel) while keeping the connectivity and an amount of image data is made as $1/n^2$ and then stored once in a memory. Then, an extracting processing of the connectivity of the pattern is performed while reading an image from the memory. With this arrangement, the selecting processing of the connectivity can be performed asynchronously with regard to the detection of pattern and the amount of data is $1/n^2$, so that a load of the extracting processing of the connectivity is reduced. As a result, even in case that the high speed pattern detector is applied to constitute a device in which the pattern inspection can be carried out in a short period of time, a low speed connectivity extraction processing device can be used and a high speed pattern inspection device can be constituted in less expensive manner.

After the connectivities are compared to each other to select a pattern having a defect therein, a shape of the pattern stored in the memory is read out again and its shape is analyzed, thereby the defect position can be identified.

The foregoing and other objects, advantages, manner of operation and novel features of the present invention will be understood from the following detailed description when read in connection with the accompanying drawings.

BRIEF DESCRIPTION OF THE DRAWINGS

FIG. 6 is a view for showing a method for specifying a position of a defect of short (circuit).

FIG. 7 is a view for showing a specifying a position of a defect of an open (circuit).

FIGS. 11(a)–11(d) are views for showing a secondary differentiating local operator for use in binarizing operation.

FIGS. 12 to 14 are a view for showing a processing in a binarizing circuit shown in FIG. 10, respectively.

FIG. 15 is a view for showing an example of processing of a smoothening filter.

FIG. 19 is a view for illustrating an image size reduction method.

FIGS. 20 to 22 are views for illustrating a method for reducing an image size while keeping a connectivity.

FIGS. 27 to 34 and FIGS. 37 to 40 are views for illustrating a processing mask, respectively.

FIG. 41 is a view for illustrating a data structure of a connection data.

FIG. 42 is a view for showing a data structure of a design data.

FIG. 43 is a view for illustrating a method of pursuing a pattern edge.

FIG. 44 is a view for showing definitions of N, W, E and S.

FIG. 48 is a view for illustrating an operation.

FIG. 53 is a view for showing a data structure of one pixel in case that an area is retained.

FIG. 54 is a view for showing a value of area data in case that an area of the pattern shown in FIG. 21 is retained.

DETAILED DESCRIPTION

Figure 1:
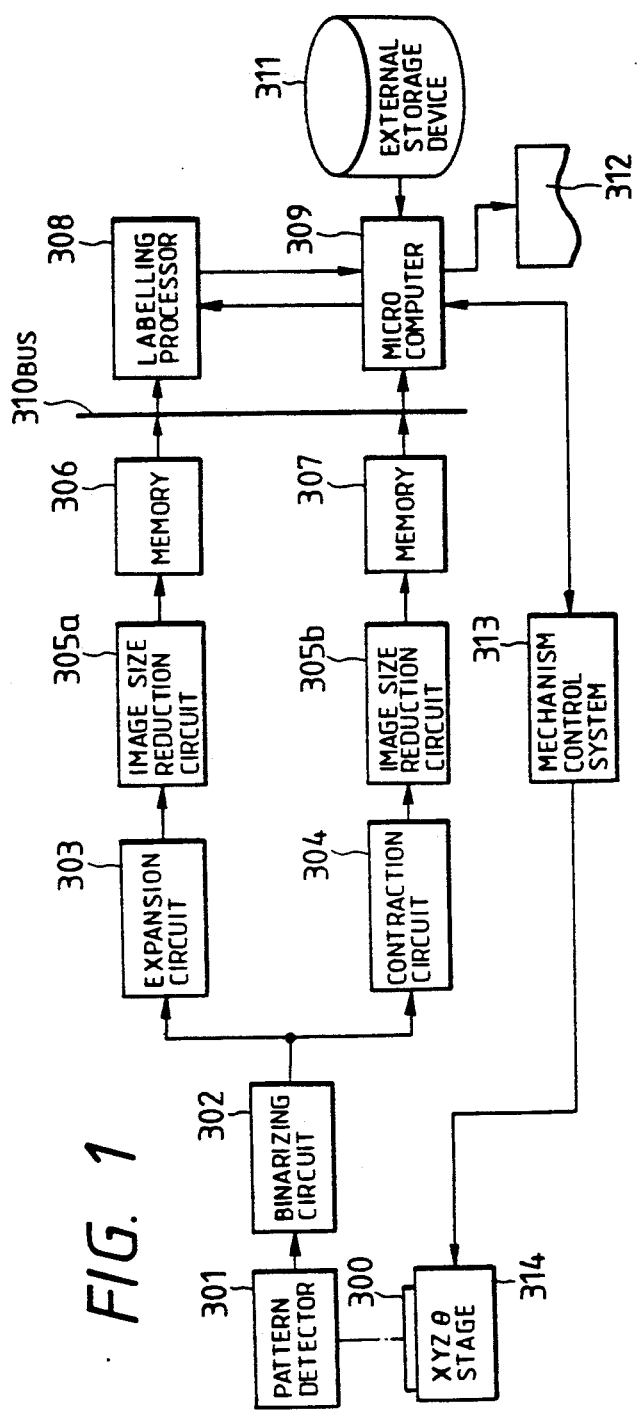
FIG. 1 is a view for showing a first preferred embodiment of the device of the present invention.

Referring now to the drawings, preferred embodiments of the present invention will be described in detail. FIG. 1 shows a block diagram of an embodiment of the apparatus of the present invention and FIG. 3 illustrates an example of processing.

An entire inspection device is controlled by a microcomputer 309. An inspected item 300 is mounted on XYZθ stage 314, a mechanism control part 313 operates the XYZθ stage 314 under an instruction from a microcomputer 309, thereby a pattern detector 301 may detect an entire pattern of the inspected item 300. A secondary pattern detected by the pattern detector 301 is binarized by a binarizing circuit 302 and then is fed to an expansion circuit 303 and a contraction circuit 304. In this case, a pattern is processed for its expansion and contraction for its specified value, wherein a semi-short (circuit) is converted into a short (circuit) (a short circuit is kept as it is) and a semi-open (circuit) is converted into an open (circuit) (an open circuit is kept at as it is). Then, a reduction of image size is performed, while keeping a connectivity, by the image size reduction circuits 305a and 305b and each of the image data is stored in the memories 306 and 307. Memories 306 and 307 are arranged on a bus 310 of the micro-computer 309. At first, the content of each of the memories 306 and 307 is read out by a labelling processor 308 so as to extract a connectivity of the pattern. A result of selection of the connectivity is transmitted to the micro-computer 309, compared with a normal connectivity data and then a detection of defect is carried out. Then, the micro-computer 309 may analyze the image data stored in the memories 306 and 307 in respect to the circuit pattern having a defect therein and output a position of defect at 312.

An example of the processing according to the preferred embodiment of the present invention will be described with reference to FIG. 3.

Figure 3:
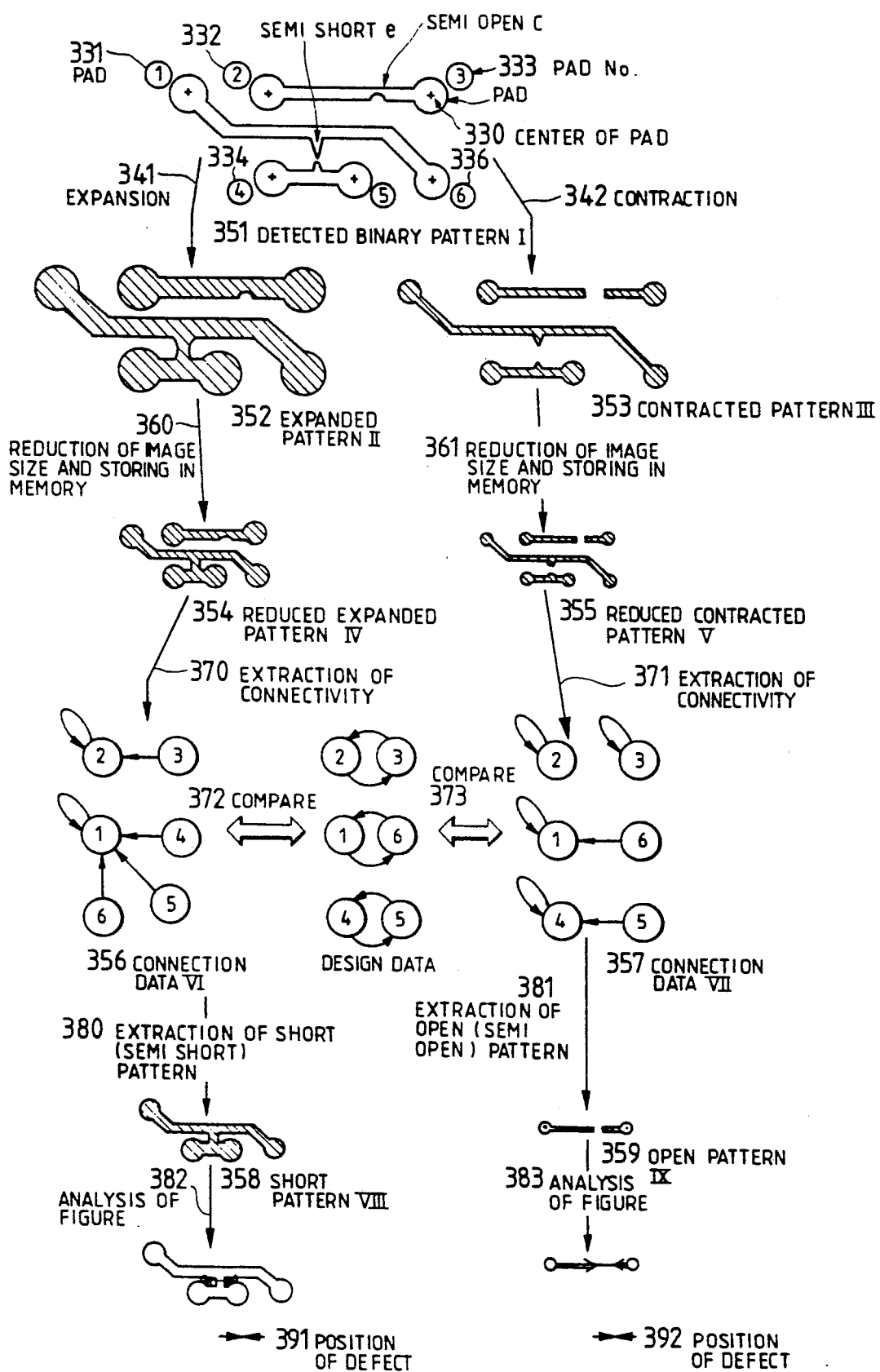
FIG. 3 is a view for showing an example of processing of the method of the present invention.
Figure 4A:
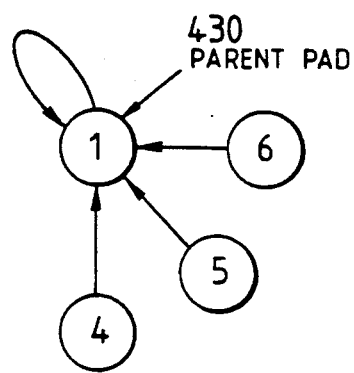
FIGS. 4(a) and 4(b) are views showing examples of connection data.
Figure 5:
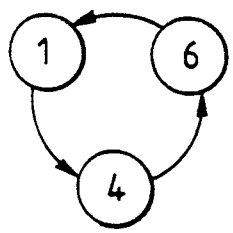
FIG. 5 is a view for showing an example of a design data.
Figure 4B:
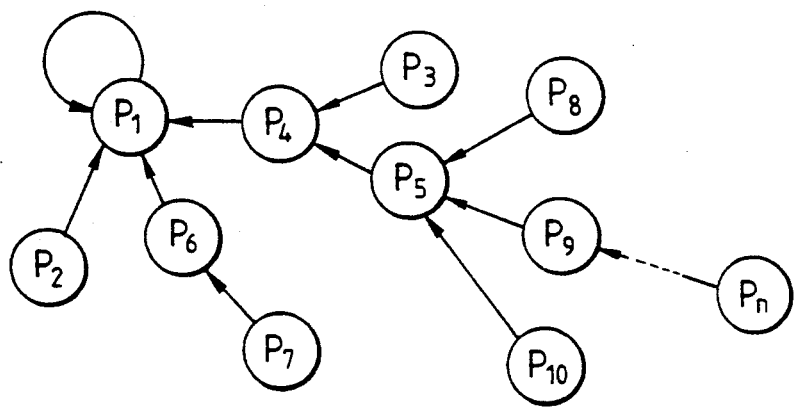

A detection binary pattern 351 illustrated in FIG. 3 is constituted to connect pads ② 332 and ③ 333, the pads ① and ⑥ and pads ④ 334 and ⑤ 335 (a center 330 between each of the pads ① to ⑥ is provided with a mark +) and in the illustrated example, a defect of semi-open (circuit) (c) and a semi-short (circuit) (e) are present. At first, the detected binary pattern is expanded to get an expanded pattern II, 352. A contraction of the detected binary pattern causes a contracted pattern III 353 to be attained. With this arrangement, the semi-short (circuit) is converted into a short (circuit) and a semi-open (circuit) is converted into an open (circuit). Then, a reduction of image size is carried out while keeping a connectivity of the pattern so as to get a reduced expanded pattern IV 354 and a reduced contracted pattern V 355. A connectivity of pattern including a short (circuit) and an open (circuit) is not varied through this conversion. Then, a connectivity caused by a pattern between the central positions of the pads which are predetermined is extracted and as shown in the figure, it is expressed as connection data VI 356 and connection VII 357 having an effective branch structure. This is defined as a connection data. The connection data is an effective branch and its arrow indicates a connectivity between the pads. For example, the connection data shown in FIG. 4(a) shows that the pad ① 331, is connected to pads ④ 334, ⑤ 335 and ⑥ 336 connected to each other and the connection data shown in FIG. 4(b) shows that the pads $P_l$ to $P_n$ have a defined connection pattern. Among these pads, the pad acting as a root of the branch having its arrow directed toward itself (the pad ① in the example of FIG. 4(a) and the pad $P_l$ in the example of FIG. 4(b)) is defined as a parent pad 430. In the connection data in respect to one connected pattern there is only one parent pad. Although the example in FIG. 4(a) shows a branch having a depth 1, any branch having any depth, such as shown in FIG. 4(b), may be applied. In turn, as illustrated in FIG. 5, a normal connectivity between the pads is expressed by one circulating list structure. This is defined as a design data. All the pad numbers to be connected can be got by circulating one circulation list along the arrows. In case of FIG. 5, it means that the pads ①, ④ and ⑥ are to be connected.

It is assumed now that the connection data VI 356 and connection data VII 357 as shown in FIG. 3 are extracted for each of the expanded and reduced binary pattern IV 354 and the contracted and reduced binary pattern V 355, respectively A survey of the connectivity corresponding to each of the arrows in reference to the design data for the connection data VI 356 for the reduced expanded pattern IV 354 shows that a connectivity of ④→① and ⑤→① is not present in one circulation list of design data. As a result, it is apparent that the pattern including pads ①, ④, ⑤ and ⑥ have a short (circuit) (or semi-short (circuit)) defect. In turn, a survey of parent pads ①, ②, ③ and ④ of the connection data VII 357 in respect to the reduced contracted pattern V in view of design data shows that the parent pads ① and ④ are only one parent pad within one circulation list of the design data and the parent pads ① and ④ are present together within one circulation list of design data. Since this means that the pattern is divided into two portions, it shows that the pattern including the pads ② and ③ has an open (circuit) (or a semi-open (circuit)). As a comparing method for the connectivity, a similar method as disclosed in U.S. Pat. No. 4,654,583 may be applied.

In view of the above results, a pattern VIII 358 having a short (circuit) (or a semi-short (circuit)) defect and a pattern IX 359 having an open (circuit) (or a semiopen (circuit)) defect are separated and identified. Then, in reference to FIGS. 6 and 7, a method for specifying positions of a short (circuit) defect and an open (circuit) defect in view of the short (circuit) pattern VIII 358 and the open (circuit) pattern IX 359 is described.

At first, an edge of the pattern having a defect generated therein is analyzed and a series of edge coordinate sequence is calculated. When an edge coordinate sequence in respect to an expanded pattern is defined as $(x_0, y_0)$ 630 - $(x_1, y_1)$ 631, -....-$(x_n, y_n)$ 635, edge coordinates near the center positions of the pads ①, ④, ⑤ and ⑥ within the pattern are obtained and then these coordinates are defined as $(x_{i1}, y_{i1})$ 641, $(x_{i4}, y_{i4})$ 642, $(x_{i5}, y_{i5})$ 643 and $(x_{i6}, y_{i6})$ 644 (FIG. 6). Dividing of the edge coordinate series $(x_0, y_0)$ - $(x_1, y_1)$ -....-$(x_n, y_n)$ generates in accordance with these center pad coordinate four coordinates of $(x_{i1}, y_{i1})$ -....-$(x_{i6}, y_{i6})$, $(x_{i6}, y_{i6})$- ... $(x_{i5}, y_{i5})$, $(x_{i5}, y_{i5})$ - .... -$(x_{i4}, y_{i4})$, $(x_{i4}, y_{i4})$ - .... -$(x_{i1}, y_{i1})$. Referring now to the design data (FIG. 3), there is a connectivity between the pads ①→⑥, ⑤→④ and there is no connectivity between ⑥→⑤ and ①→④. Thus, $(x_{i6}, y_{i6})$-....-$(x_{i5}, y_{i5})$, $(x_{i4}, y_{i4})$-....-$(x_{i1}, y_{i1})$ are two illegal edge coordinate sequences. Then, a distance between each of the points of the two edge coordinate sequences is calculated and a minimum pairs of edge coordinates $(x_{f1}, y_{f1})$ 663 and $(x_{f2}, y_{f2})$ 664 are defined as a short (circuit) (or a semi-short (circuit)) defect position 660 (FIG. 6).

In turn, if it is assumed that an edge coordinate sequence in respect to a pattern of contraction having a defect therein is defined as $(x_o^o, y_o^o)$ 730-....-$(x_p^o, y_p^o)$ 733, $(x_o', y_o')$ 734-...-$(x_q', y_q')$ 735 (FIG. 7), a distance between each of the points in these two edge coordinate sequences is calculated and edge coordinate pairs having a minimum distance $(x_j^o, y_j^o)$ 751, $(x_k', y_k')$ 752 are defined as an open (circuit) (or a semi-open (circuit)) defect position 750 (FIG. 7).

In FIG. 3, the detected binary pattern can be attained by binarizing an image signal detected by the pattern detector with a binarizing circuit. A preferred embodiment of the pattern detector and the binarizing circuit is described below.

Figure 8:
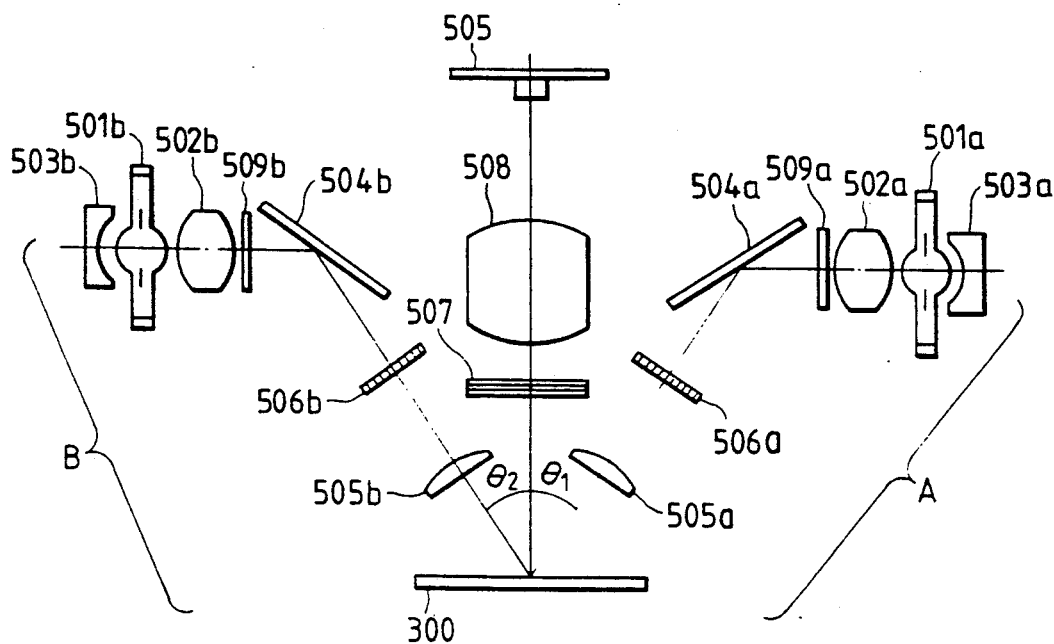
FIG. 8 is a view for showing a practical example of a pattern detector.

FIG. 8 illustrates a practical example of a pattern detector 310. Radiation lights from mercury lamps 501a and 501b are fed in one direction through collector lenses 502a and 502b and reflector mirrors 503a and 503b, their wave lengths are restricted to 350 nm to 750 nm through optical filters 509a and 509b, thereafter the radiation lights are reflected by reflector mirrors 504a and 504b, deflected in one direction by polarizing plates 506a and 506b, compressed into a slit form (a vertical direction to a sheet) with cylindrical lenses 505a and 505b and then radiated onto an inspected item 300 from an inclined upper direction. In FIG. 8, a polarizing light radiation system A and a polarizing radiation system B are arranged to face to each other. It is preferable that incident angles $\theta_1$ and $\theta_2$ are near 0° as much as possible and a difference between the angles $\theta_1$ and $\theta_2$ is less than 10°. Above the inspected item 300 is arranged a polarizing plate 507 in such a direction as its polarizing direction is crossed at a right angle with the polarizing plates at the radiation side. Further, the inspected item pattern is formed on a linear sensor 505 by the lens 508. The linear sensor 505 is arranged such that its direction is perpendicular to the sheet surface and coincides with an arranging direction of a photosensor and then an optical image of the inspected item pattern is converted into an electrical signal. A two dimensional image of the inspected item pattern is detected by moving the inspected item 300 in a rightward or a leftward direction in a sheet at a specified speed. With the above-described arrangement, the set positions of the polarizing plates 506a and 506b do not necessarily correspond to those shown in the drawing, but can instead correspond to the positions adjacent where the radiation lights pass through the optical filters 509a and 509b. However, it is preferable that they are set at a location where light fluxes are diverged, for example, within the parallel light fluxes rather than the place where the radiation lights are concentrated. With the above-described arrangement, since a direct radiation is carried out through a quite light polarizing light compressed in slit form without passing through a half-mirror, a high speed detection can be attained. As one example, in an optical system in which the inspected item is a ceramic, a mercury lamp is of 250 W and a polarizing plate with a permeability of about 40% is applied. A CCD linear sensor is operated with 30 MHz and then a signal having a sufficient S/N ratio can be attained. In the preferred embodiment of the present invention, although the CCD linear sensor is used in the detector, a normal TV camera is may also be used. In this case, a normal lens is used in place of the cylindrical lens 505a, 505b the inspected item is moved in a stepwise manner and then an entire inspected item pattern is detected.

Figure 9:
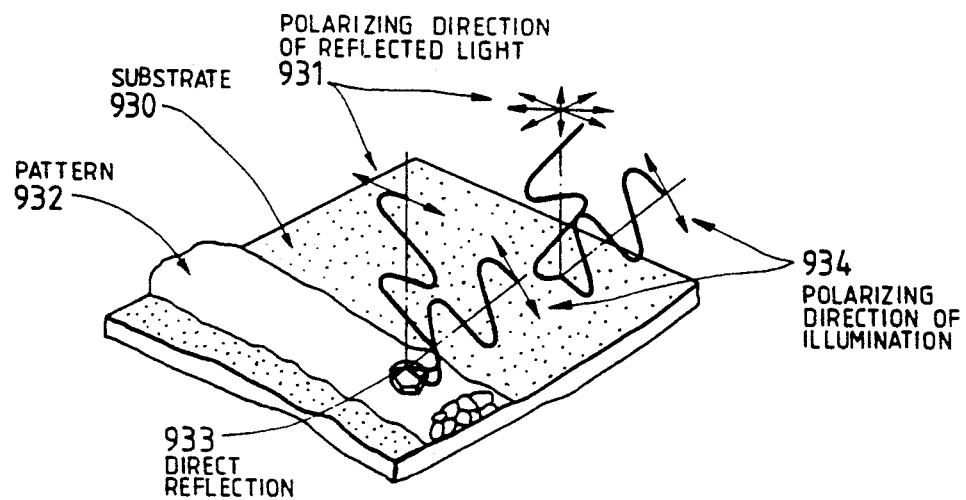
FIG. 9 is an illustrative view for illustrating a principle of polarizing detecting method.

According to the pattern detector of the present invention, since the inspected item is radiated by a polarizing light and only a polarizing component perpendicular to a polarizing direction of lighting is detected, for example, a base material having a characteristic for diverging light such as a ceramic substrate or a green sheet etc. can be detected in light state, while the metallic circuit pattern on the substrate or green sheet can be detected in a dark, and well contrasted state. As shown in FIG. 9, this is due to the fact that a light is diverged at the substrate 930 and a polarizing light is disturbed, so that its reflected light has, as shown at 931, all polarizing directions and a direct reflection light 933 from the metallic circuit pattern 932 keeps a polarizing light in a specified direction as shown at 934. As a result of the capability of detecting an image having a more superior contrast, the present invention has an effect that a highly accurate automatic pattern inspection can be realized.

As the pattern detector, any one of a number of well-known detecting methods such as a passing radiation inspection method, a drop radiation detection method and a fluorescent light detection method etc. other than the preferred embodiment of the present invention may be applied in reference to the inspected item.

Figure 10:
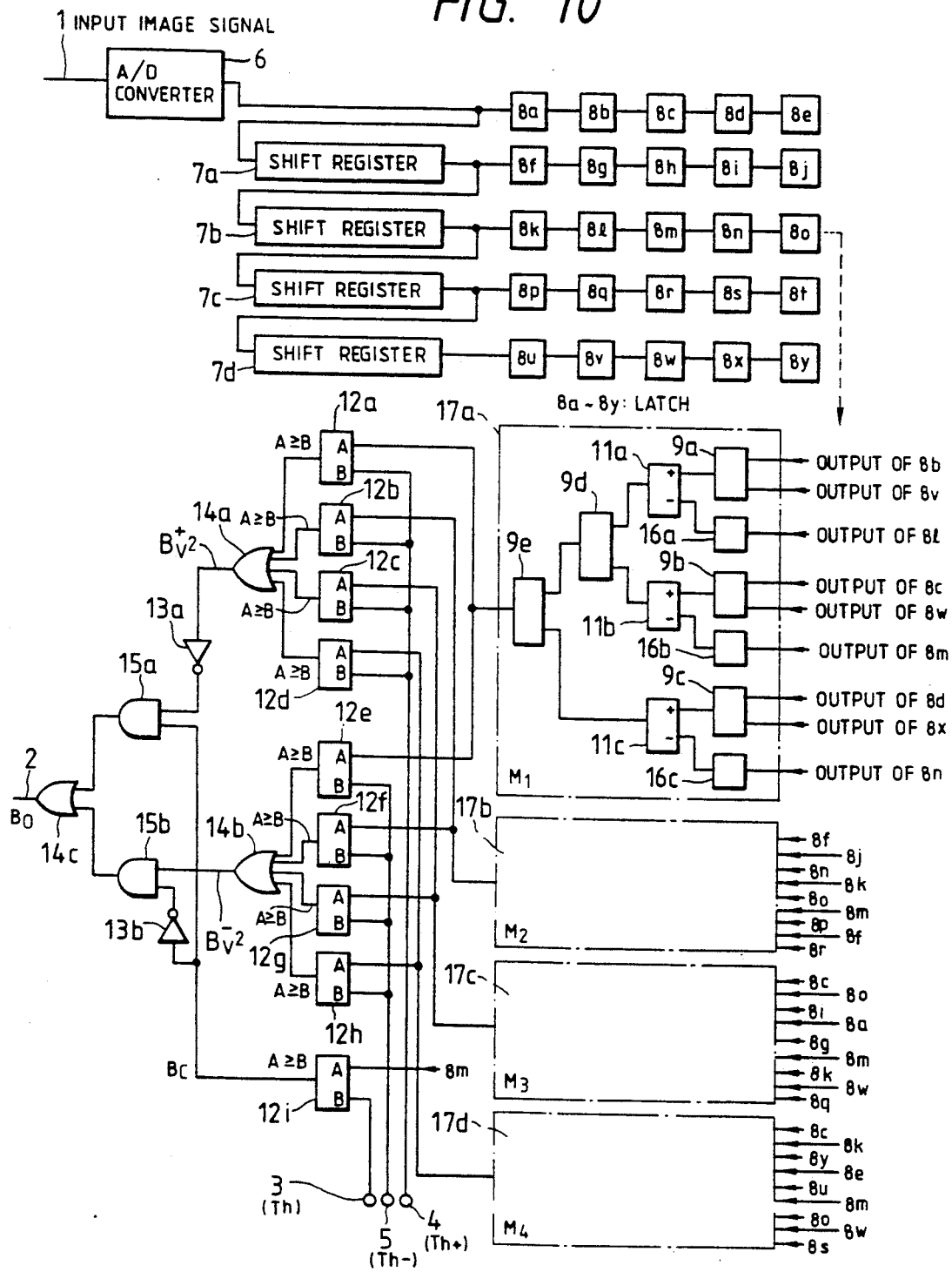
FIG. 10 is a view for illustrating a practical example of a binarizing circuit.

FIG. 10 illustrates a practical example of a binarizing circuit 302. This circuit is operated such that the secondary differentiating local operators $M_1$ to $M_4$ shown in FIG. 11 (a) to (d) are applied and a narrow width short (circuit) or an open (circuit) is realized and detected. Each of $M_1$ to $M_4$ may act to perform a selective detection of a short (circuit) or an open (circuit) or a pattern edge near a direction 0°, 90°, +45° and −45°, respectively. After an input signal 1 is converted into a digital signal by an A/D converter 6, data of 5×5 pixels are simultaneously outputted by four shift registers 7a to 7d for generating a delay of one horizontal line and 25 latches 8a to 8y. In turn, there is a summation with the coefficients shown in FIG. 11(a) to (d). In FIG. 10, outputs of 17a to 17d become a summation result attained by the local operators $M_1$ to $M_4$. That is, a plurality of adders 9, subtractors 11 and duplex unit 16 are connected as shown, each of the outputs of the latch shown is inputted and a summation result is outputted. The duplex unit 16 can easily be realized by simply shifting by one bit to an upper digit and setting the lowermost bit to 0. If these results are inputted to comparators 12a to 12d and 12e to 12h, compared with threshold values Th+4 and Th−5 and a logical sum of the output results is obtained, an edge part and the short (circuit) part inside the pattern are outputted at an output $B\bar{p}2$ of OR gate 14a, and an edge part outside the pattern and the open (circuit) part are outputted at an output $B\bar{p}2$ of the OR gate 14b (FIG. 13 (a) and (b)). In turn, when a value 8 m of a central pixel with 5×5 pixels is inputted to a comparator 12i, compared with a binarizing threshold value Th3 and this result is defined as Bc (FIG. 13 (c)), a binarizing pattern signal Bo2 (a pattern part: 0, a background: 1) is expressed as follows:

$$Bo = \overline{B\bar{p}2 \cdot Bc} + \overline{B\bar{p}2 \cdot Bc} \quad (1)$$

Figure 13A:
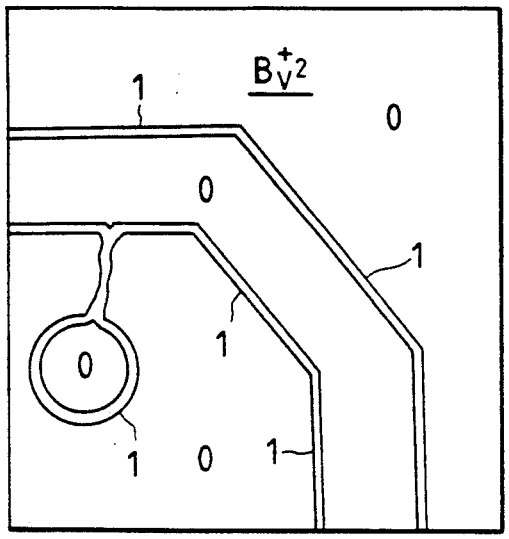
Figure 13B:
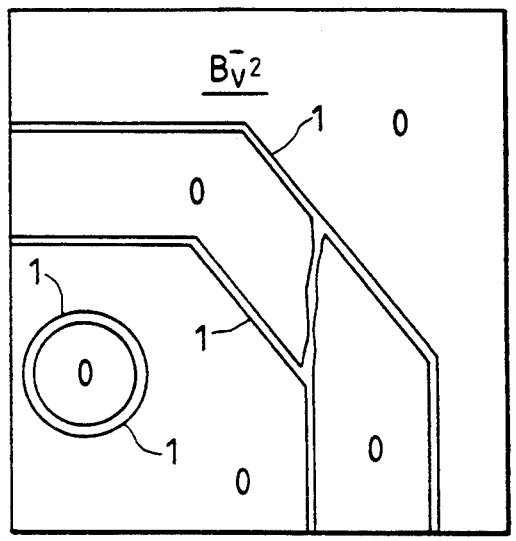
Figure 13C:
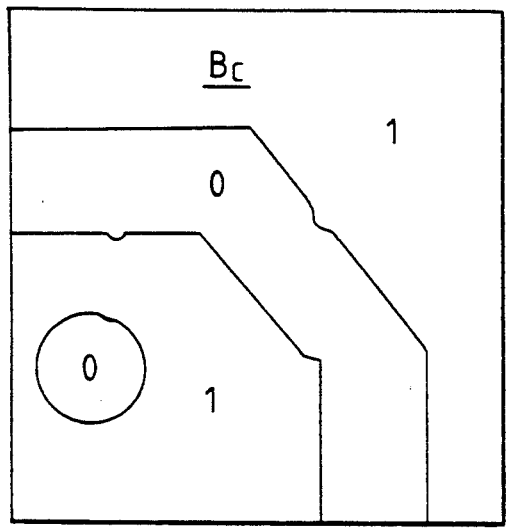
Figure 13D:
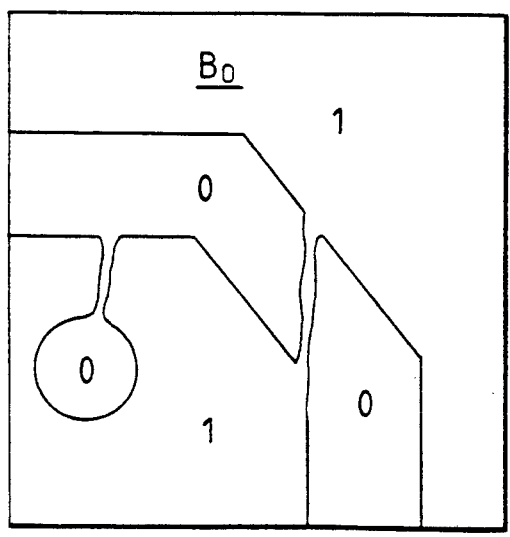

(FIG. 13(d)). In the equation (1), (−) denotes an inversion, (·) denotes a logical product and (+) denotes a logical sum. A pattern 1211 shown in FIG. 12 is processed in accordance with the preferred embodiment of the present invention and its result is shown in FIG. 13. A processing for the part along CC' in FIG. 12 is shown in FIG. 14 for its steps. The equation (1) can be realized by AND gates 15a and 15b, NOR gates 13a and 13b, and OR gate 14c. The values of Th, Th+ and Th− fulfill the following conditions.

$$Th > 0, \ Th+ > 0, \ Th- < 0 \quad (2)$$

For example, in case that a mean brightness of the background 1221 is 220 and the pattern part 1211 is 20, it may be adjusted to have the most suitable state around the values of Th=100, Th+=60 and Th−+−30 or so.

In case that there are several noises in an image signal, a smoothing filter may be inserted just after the A/D converter 6. FIG. 15 illustrates a preferred embodiment of a mean value filter having 3×3 pixels as one example. Data of 3×3 pixels are simultaneously outputted through two shift registers 52a and 52b for generating a delay of one horizontal line and through nine latches 51a to 51i. Their sum is obtained by an adder 53, divided by 1/9 by a divider 54 and then outputted. In case that an input mean level and an output mean level can be different to each other, a setting of ⅛ causes the lower three bits to be ignored and merely outputted, resulting in that the divider 54 can be eliminated.

According to the preferred embodiment of the present invention relating to the binarizing circuit, the result of calculation of the secondary differentiating local operators is binarized and combined with a binarizing pattern of the fixed threshold value, so that a narrow width open (circuit) or a short (circuit) having less variation in brightness can also be detected accurately as a binarizing pattern and it has an effect capable of realizing an automatic inspection with less faulty detection of defects.

Figure 51:
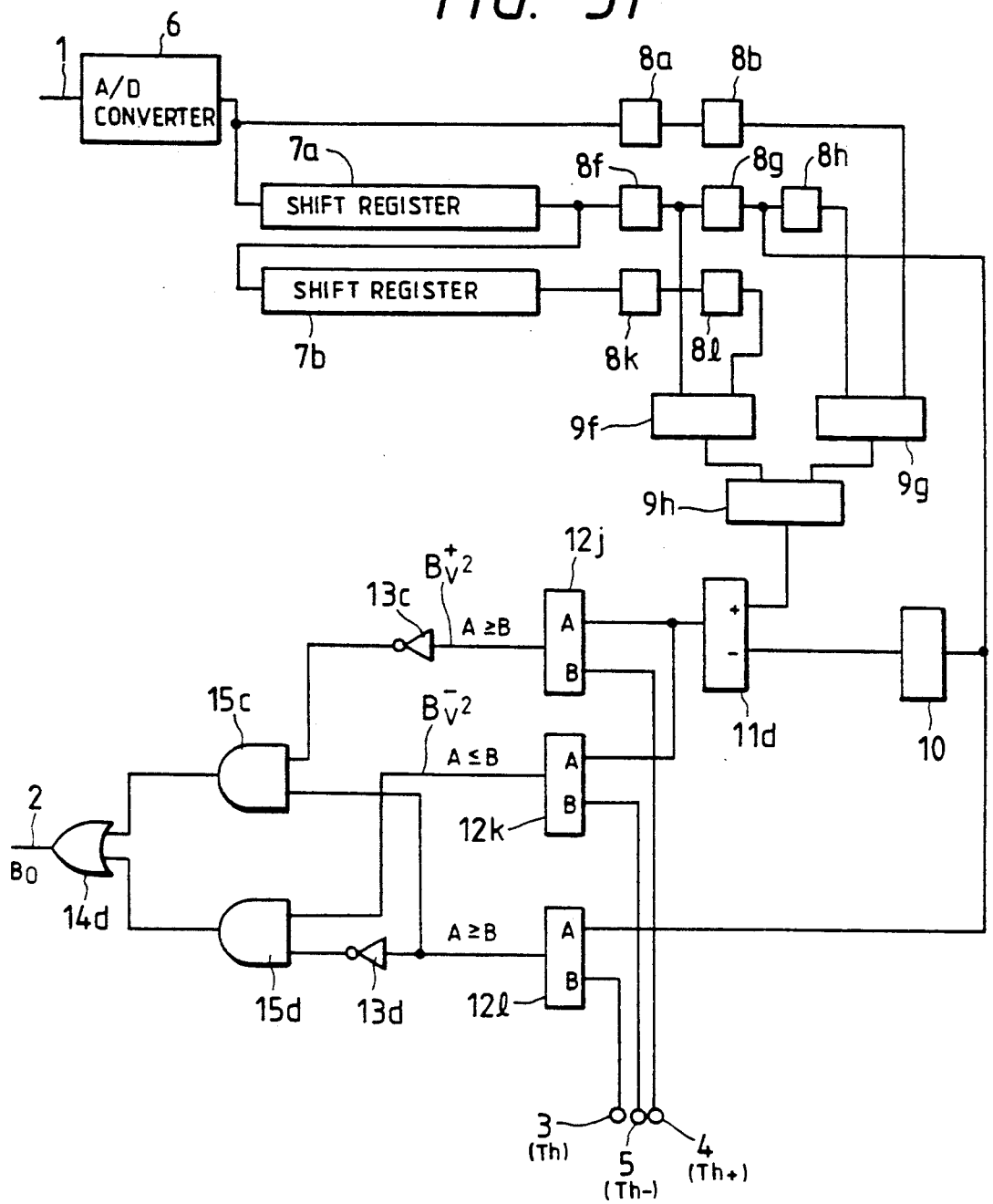
FIG. 51 is a view for illustrating a fundamental configuration of another preferred embodiment of a binarizing device of the present invention.
Figure 52:
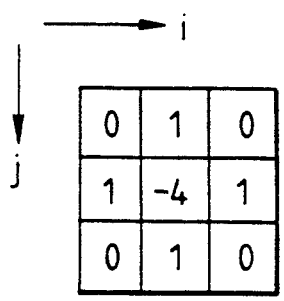
FIG. 52 is a view showing one example of the local oscillation of FIG. 51.

In FIG. 51 is illustrated another preferred embodiment of the binarizing circuit of the present invention. In this embodiment of the present invention, the secondary differentiating local operators shown in FIG. 52 are applied to realize a minute variation in brightness and to detect the binarizing pattern. Although the image signal 1 converted into multi-value digital image signal through A/D converter 6 is passed in sequence through shift registers 7a and 7b generating a delay of one horizontal line, an output from the A/D converter 6 is shifted to the latches 8a and 8b, a shift output from the shift register 7a is shifted to the latches 8f to 8h and a shift output from the shift register 7b is shifted to the latches 8k and 8l. The multi-value digital signals of five pixels required for a calculation of the local operators shown in FIG. 52 can easily be attained. Units 9f to 9h are used to obtain $(I(i+1, j)+I(i-1, j)+I(i, j+1)+I(i, j-1))$, wherein $4I(i, j)$ is obtained from a four-times unit 10 and $I(i+1, j)+I(i-1, j)+I(i, j+1)+I(i, j-1)-4I(i, j)$ is obtained from the subtractor 11d. This output is compared with each of the fixed threshold values (Th+, Th−) 4 and 5 by comparators 12j and 12k, and each of $B\bar{v}+2$ and $B\bar{v}-2$ is obtained from the comparators 12j and 12k respectively. In turn, multi-value digital signal from the latch 8g is compared with the fixed threshold value (Th)3 by the comparator 12l and then the value Bc is obtained. A logical calculation is carried out in accordance with the following logical equation so as to get a binary pattern signal Bo.

$$Bo = \overline{B\bar{v}2} \cdot Bc + \overline{B\bar{v}2} \cdot \overline{Bc} \qquad (1)'$$

Operation of the preferred embodiment is carried out in the same manner as that of the previous preferred embodiment described in relation to FIGS. 12 to 14. According to this preferred embodiment, even minute variation of a detected image signal can be realized with a small-sized circuit and a binarizing pattern can be attained.

As the binarizing circuit, a well-known binarizing system such as a binarizing through a fixed threshold value and a binarizing through a floating threshold value may be applied in addition to the system illustrated in the preferred embodiment.

Figure 2:
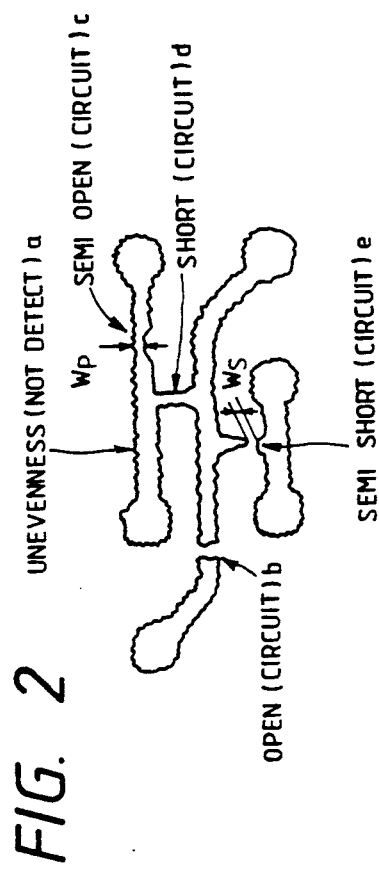
FIG. 2 is a view for showing a pattern of a detected item.
Figure 16:
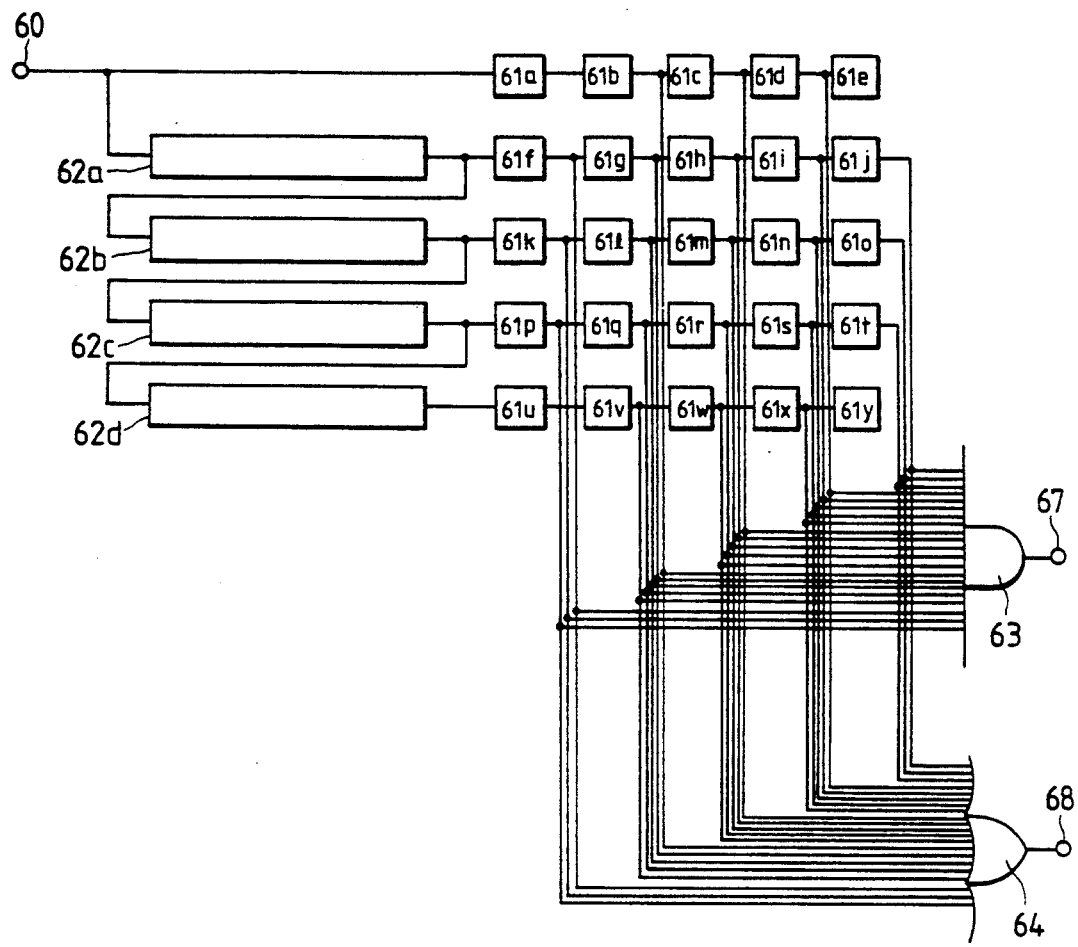
FIGS. 16 and 17 are views for illustrating a practical example of an expansion circuit and a contraction circuit.

Practical examples of the expansion and contraction circuits, 303 and 304 respectively, are also illustrated. FIG. 16 illustrates an expansion and contraction circuit with a size of five pixels. In this circuit, the pattern is defined as 1 and the background is defined as 0. In case that the pattern is 0 and the background is 1, it is realized by inserting NOT gate into the input part and an output part (an expansion signal and a contraction signal). An input two-value signal 60 is inputted in sequence to four shift registers 62a to 62d generating a delay of one horizontal line and five latches 61a to 61e, and data of $5 \times 5$ pixels is simultaneously outputted from the latches 61a to 61y. An expansion signal 68 is inputted to AND gate 63 with an output of latch entering an approximate circle corresponding to a diameter of 5 pixels being inputted to OR gate 64 at a center of a latch 61m of a central part in FIG. 16, thereby a contraction signal 67 is obtained. An expansion size Se and a contraction size Ss are determined by the following equations when a pattern spacing of the semi-short (circuit) to be detected is defined as Ws (FIG. 2) and a pattern spacing of the semi-open (circuit) is defined as Wp (FIG. 2):

$$Se = \left[\frac{Ws}{P}\right] + 1 \qquad (3)$$

$$Ss = \left[\frac{Wp}{P}\right] + 1$$

where, P is a size of one side of a pixel. [] indicates a round-off less than decimal point. For example, when $P = 10\ \mu m$, a case in which a value of $Ws = Wp = 40\ \mu m$ is applied corresponds to an expansion and a contraction of a pixel of size 5. In general, the expansion and contraction circuit with a size S can be realized by a circuit configuration in which data of $S \times S$ pixels are taken out simultaneously by using a circuit similar to that shown in FIG. 16 taking data within an approximate circle corresponding to a diameter S pixel.

Figure 17:
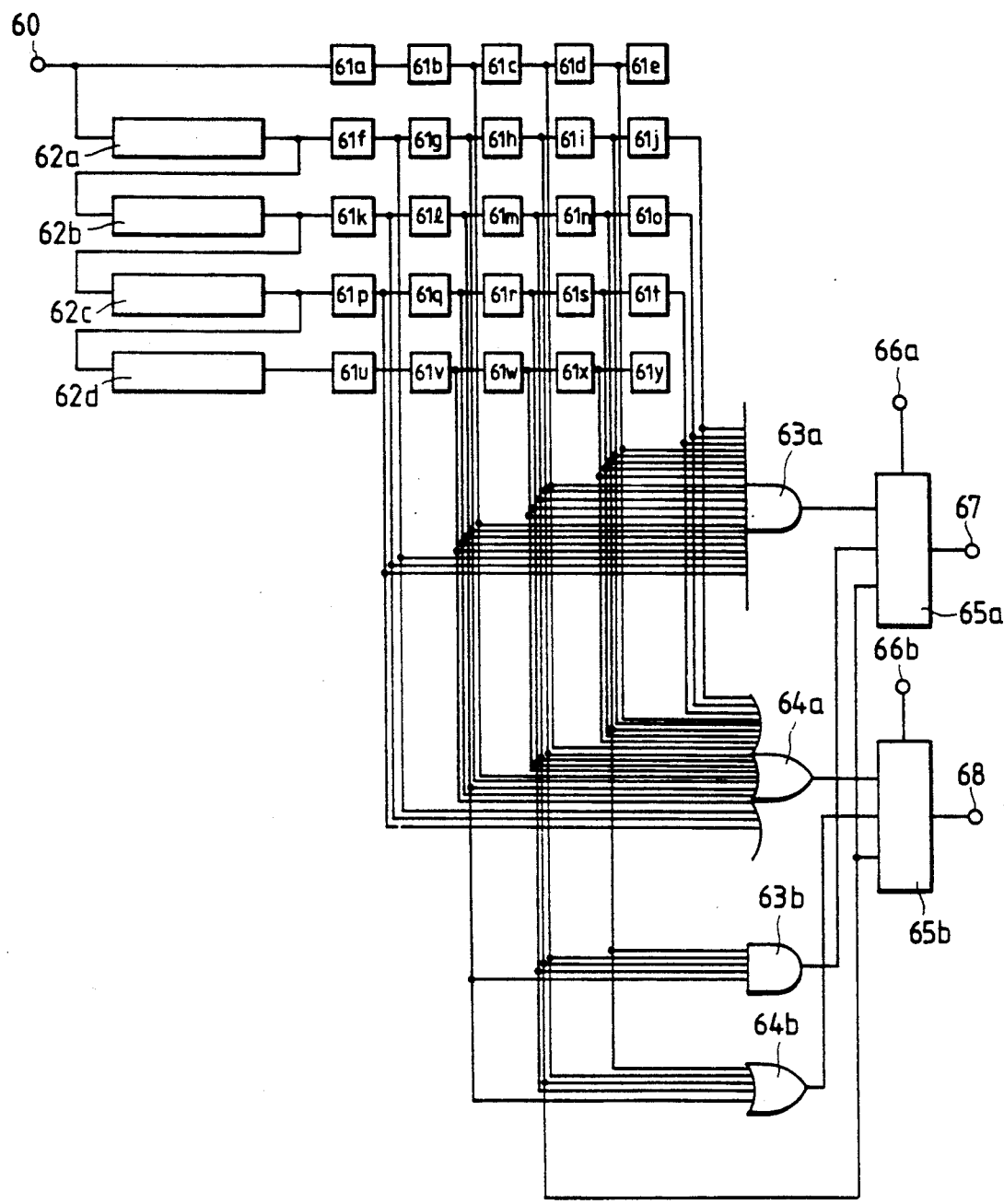

In FIG. 17 is illustrated another practical example of an expansion and a contraction circuit. In this practical example, expansion signals of 3 pixels and contraction signal of 1 pixel are generated by latches 61a to 61y of $5 \times 5$ pixels in addition to the expansion and contraction signal of a size S pixels. The expansion size and the contraction size can be selected individually by the selectors 65a and 65b in response to the changing-over signals 66a and 66b. If the number of shift registers and latches is increased, an expansion and contraction processing for various expansion sizes and contraction sizes can be selectively realized with a similar circuit and thus they can be accommodated resiliently for various pattern inspections of defect discrimination standard.

A preferred embodiment of the method for reducing an image size while keeping a connectivity and the circuits 305a and 305b is described below.

Figure 18A:
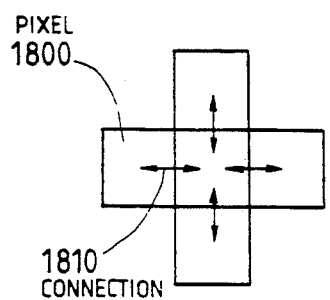
FIGS. 18(a) and (b) are views for showing definitions of 4 connections and 8 connections.
Figure 18B:
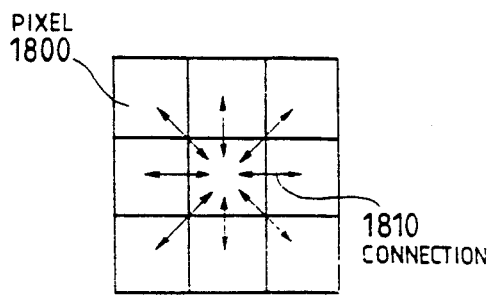

An action of a method for reducing an image size while keeping a connectivity of the present invention will be described with a value of pixel belonging to the pattern being 1 and a value of pixel belonging to a background being 0. The action can be explained in a logically equivalent manner even if the pattern is set to 0 and the background is set to 1. In this case, a connectivity of the pattern is defined as four-connection and a connectivity of the background is defined as eight-connection. In this case, the four-connection and eight-connection are defined such that the four-connection corresponds to the case in which as shown in FIG. 18(a) only the upper, lower, right and left pixels for a certain pixel 1800 are considered and there is a pixel having the same value as that of the central pixel and the pixel is connected with the central pixel (1810). In turn the eight-connection corresponds to the case in which as shown in FIG. 18(b), all the surrounding eight pixels are considered and there are some pixels having the same value as that of the central pixel and the pixels are connected with the central pixel. In case that the pattern is defined as an eight-connection and the background is defined as a four-connection, an assumption of a replacement between the pattern and the background enables the following description to be applied in an equivalent manner.

As a system for reducing a size of binary image in accordance with the preferred embodiment of the present invention, a logical sum of values of $n \times n$ pixels is obtained and this is converted into one pixel with the former value being applied as a value of pixel. (FIG. 19 illustrates a case of $n = 2$. (+) in this figure indicates a logical sum.) This processing is referred to as a pixel size reduction processing of a reduction rate of (n). This processing enables a reduction in size by 1/n and an image size of $1/n^2$ in area to be attained.

In case that such a processing as described above is independently applied to reduce an image size, it shows a problem that a connectivity in pattern is varied under a following condition.

In case that a distance (d) between the two independent patterns approaches to a value less than a $(2n-1)$ pixel, the two patterns may be connected at that portion.

The distance (d) between the patterns is defined as (d) satisfying the following equation if the independent two patterns are defined as $P_1$ and $P_2$, pixels belonging to these patterns are defined as $g \in P_1$ and $r \in P_2$ and x-coordinate of (g) and (r) is defined as (xg) and (xr) and y-coordinate is defined as (yg) and (yr).

$$d = min(max(|xg-xr|, |yg-yr|))_{g,r} \quad (4)$$

In order to prevent a variation of the above-described connectivity from being generated, a pixel fulfilling the condition of $d \leq 2n-1$ may be moved or deleted while a substantial connectivity of the pattern is kept until it does not fulfill the condition. In the preferred embodiment of the present invention, a processing of such a variation in shape of pattern is performed before executing the above-described image size reduction processing.

In general, since the definition itself of the equation (4) presumes that $P_1$ and $P_2$ are an independent patterns with respect to each other, a complete performance of modification processing for the pattern shape should be performed after processing of a label applying to the entire image and confirming the connectivity of the pattern. So, in the preferred embodiment of the present invention, a processing is restricted to a calculation of a value near $m \times m$ pixels and a processing of modification of pattern shape which can be carried out in this range is performed. With this arrangement, although there may be generated a case in which the separated patterns are connected to each other, it is often found that no influence is applied over a result of discrimination of defect of the inspection system for the above-described printed circuit pattern by restricting a rate of reduction of the image size. It may provide an effect of enabling the method of the present invention to be realized through a device under a practical size by restricting the present invention to the processing of $m \times m$ pixels.

A processing of a modified pattern shape in order to fulfill the condition of $d > 2n-1$ is described below.

As shown in FIG. 20 (a) (in case of d=2), if the distance (d) between the two patterns, which are semi-limitlessly wide, is less than $(2n-1)$ and less than 2, if the pixel is deleted by an amount corresponding to a width of $(n-1)$ pixel from a partner pattern, the condition of $d > 2n-1$ is always fulfilled and a connectivity of the pattern is not varied under an image size reduction processing with a reduction ratio of (n) (FIG. 20 (b), n=2).

In turn, as shown in FIG. 21 (a), in case that the two patterns of width 1 are present in parallel with each other to be separated by a distance d=2, the above-described processing would cause the patterns to be eliminated and so the connectivity of them can not be retained. In this case, the patterns are moved under the following processing so as to fulfill the condition of $d > 2n-1$.

(Step 1): The background is narrowed by at least $(2n-2)$ pixel while keeping its connectivity. (In case of FIG. 21 (b), n=2)

(Step 2): The pattern is narrowed by at least $(n-1)$ pixel while its connectivity is kept. (In case of FIG. 21 (c), n=2)

As a method for narrowing the background or pattern while keeping a connectivity (hereinafter called merely as a narrowing processing), a method of repeating a local processing of $3 \times 3$ pixels is already disclosed in a Report of Technical Committee of the Association of Electronic Communication PRL75-66 entitled "Considerations for Narrowing Method" by Murata. In the preferred embodiment of the present invention, a method for narrowing with a whisker-like end will be described later.

In case of FIG. 20(a), the distance of the patterns d=2 is attained by the above-described (steps 1) and $(n-1)$ pixel is deleted from the partner pattern by the (step 2), so that these (step 1) and (step 2) can be applied to the case shown in FIG. 20.

In brief, the basic principle of the image size processing with a reduction rate (n) in the preferred embodiment is as follows.

(Step 1): The background is narrowed by at least $(2n-2)$ pixel while keeping its connectivity.

(Step 2): The pattern is narrowed by at least $(n-1)$ pixel while keeping its connectivity.

(Step 3): A logical sum of every $n \times n$ pixels is attained and this value is converted into one pixel as a value of the pixel.

It is also possible to realize the image size reduction processing with a reduction rate of $n_1 \times n_2 \times \ldots$ by repeating the above-described processing with a reduction rates of $n_1, n_2 \ldots$.

Figure 22:
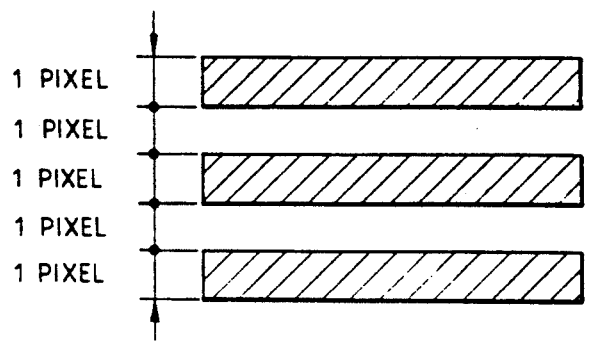

As described above, in the preferred embodiment of the present invention, the processing is limited to an approximate calculation of $m \times m$ pixels, so that it may occur that a connectivity of the patterns may not completely be maintained. That is, even after performing the (Step 1) and (Step 2), it is sometimes found that the independent two patterns fulfilling the condition of $d \leq 2n-1$ are present. For example, as shown in FIG. 22, it is the case that three patterns with a width 1 are present in parallel to each other with a distance d=2. It is necessary to make a countermeasure against such a state as above by determining a reduction rate (n) or by removing in advance a pattern out of target for keeping its connectivity in response to a nature of an input image and a nature of the pattern applied for keeping a connectivity.

Figure 23:
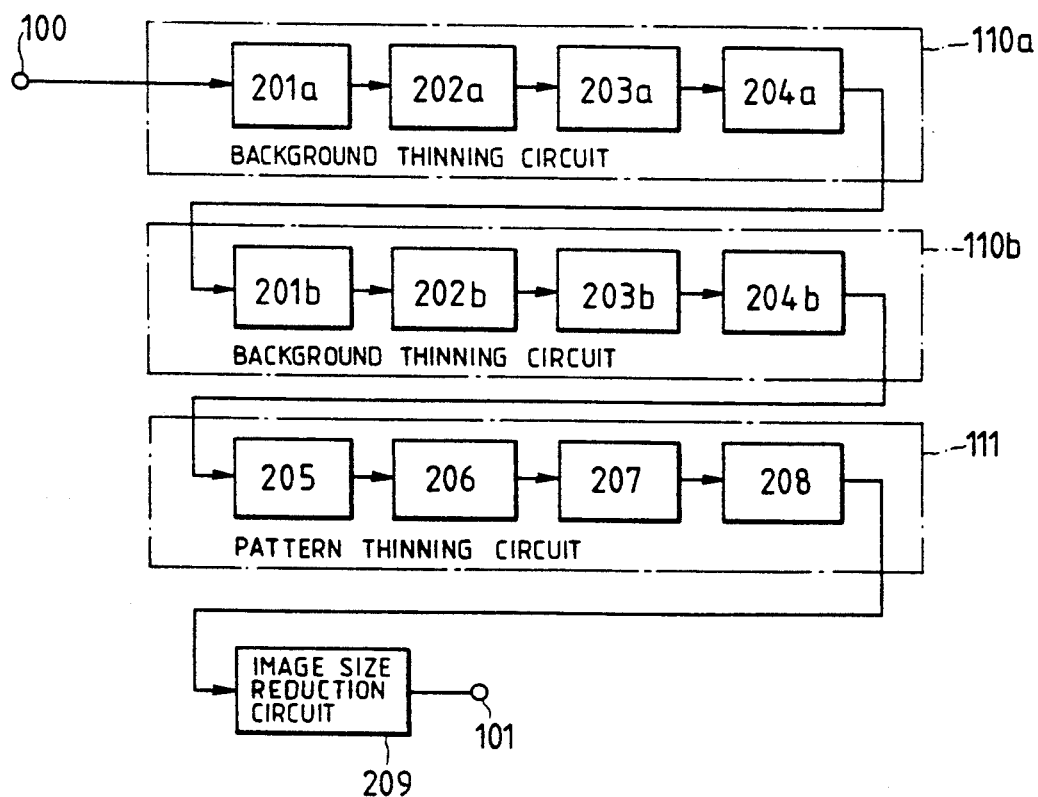
FIGS. 23, 24, 26 and 36 are views for illustrating two practical examples of circuit for reducing an image size while keeping the connectivity.

Referring now to FIG. 23, a practical example of a reduction circuit for an image size keeping a connectivity under the above-described principle will be described. In the present example of the circuit, the reduction rate (n) is 2. Reference numerals 110a and 110b denote a circuit for narrowing the background by one pixel, respectively and an input two-value image signal 100 is entirely narrowed by two pixels. A reference numeral 111 denotes a circuit for narrowing a pattern by one pixel. A reference numeral 209 denotes a circuit for making a logical sum of an area of $2 \times 2$ pixels and its output 101 becomes a reduction image signal with a reduction rate of 2.

Figure 24:
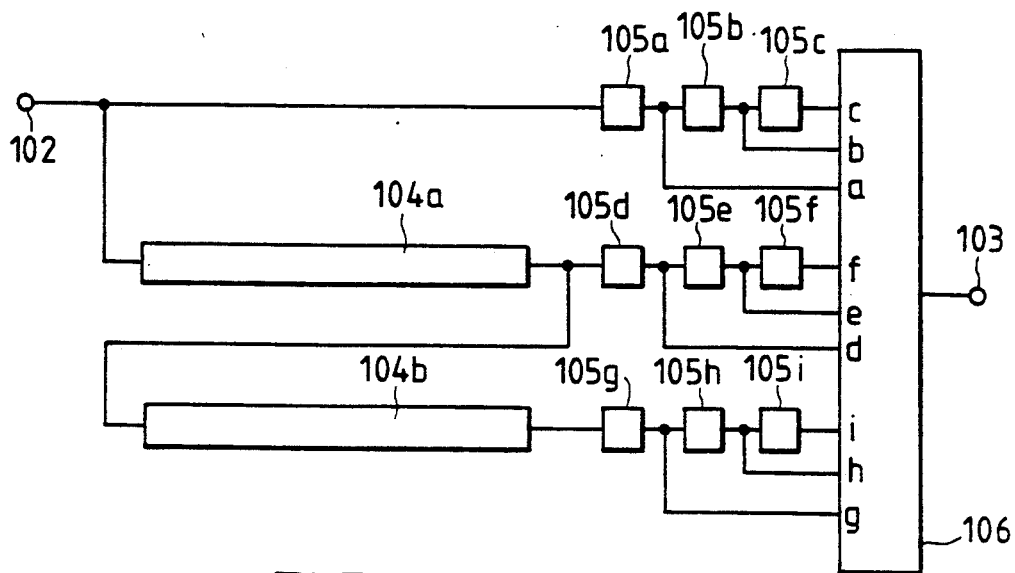

Reference numerals 201 to 208 denote a circuit practically shown in FIG. 24 and each of them is selected as a combination logical circuit 106 in response to each of their functions. Their details will be described later.

Figure 25:
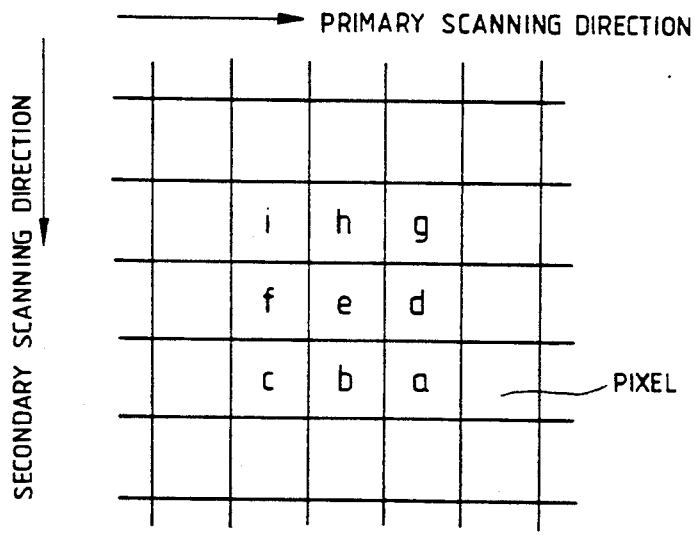
FIG. 25 is view for illustrating (a to j) of FIG. 24.

Reference numerals 104a and 104b denote a shift register of a series-input and series output type having a length of the number of pixels in a primary scanning direction of an input signal 102 which may act as a delay element of one horizontal line. This can be easily realized under a combination of a general memory and a reading/writing control circuit or an image line memory of a conventional system. In turn, a reference numeral 105 denotes a one bit latch, these are connected in series and operated in synchronism with a clock of an image signal to cause the terminals (a) to (i) of 106 in FIG. 24 to have a signal of 3×3 pixels as shown in FIG. 25. The entire circuit is operated in synchronism with a clock of an image signal to cause a result of approximate calculating processing of 3×3 pixels to be outputted from the combined logical circuit 106 as one pixel.

A logic of a combination logical circuit 106 corresponding to the circuits 201 to 208 shown in FIG. 23 is described as follows. For the sake of clarity of description, it is assumed that a square of 3×3 (hereinafter called as a mask) is drawn in response to areas (a) to (i) of a 3×3 matrix in FIG. 25, a logical product is attained by keeping a pixel of 1, reversing a pixel of 0 and ignoring a pixel of X and if its result is 1, the value indicated in the figure is outputted, and if the result is 0, the value of (e) (0 or 1) is outputted as it is. In case that a plurality of masks are indicated, if any of the results is 1, the value indicated in the figure is outputted and if all the results are 0, the value of (e) is outputted as it is. FIGS. 27 to 34 illustrate masks in sequence which correspond to the circuits 201 to 208 in FIG. 23. Within the reference numerals 110a, 110b and 111 in FIG. 23, even if the order of application of the masks of 201 to 204 and 205 to 208 is settled in any other order, similar effect can be attained.

Figure 26:
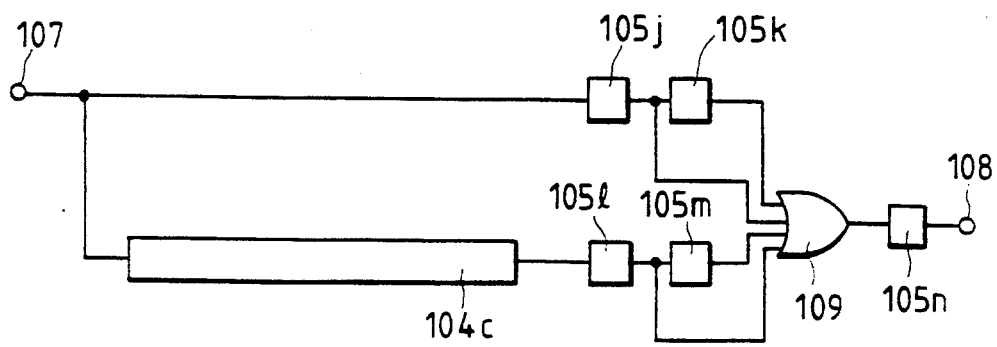
Figure 35A:
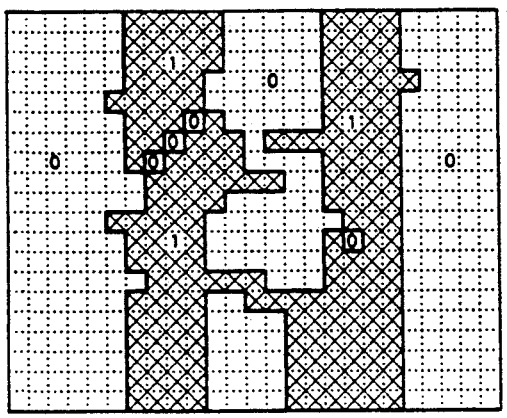
FIG. 35(a) to 35(n) is a view for illustrating an example of processing shown in FIG. 23.
Figure 35B:
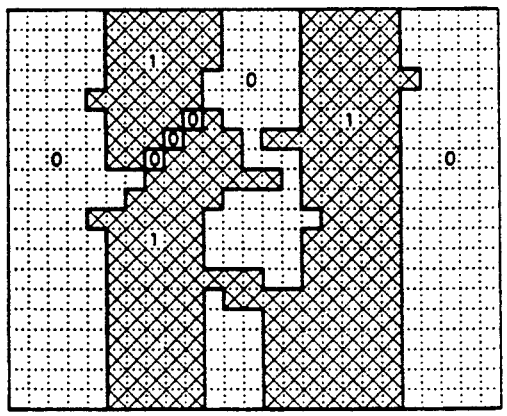
Figure 35C:
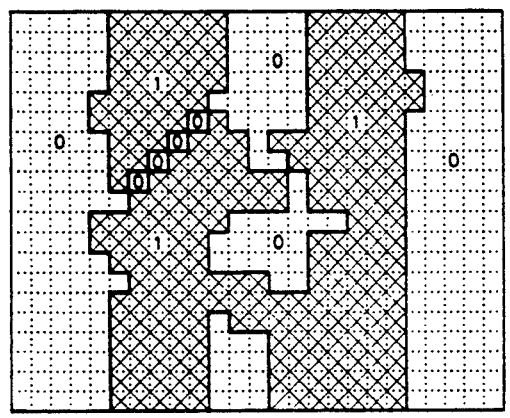
Figure 35D:
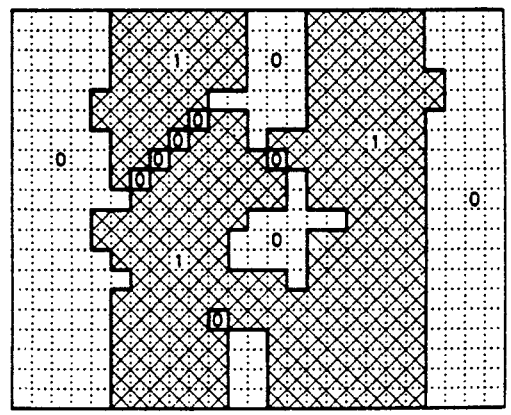
Figure 35E:
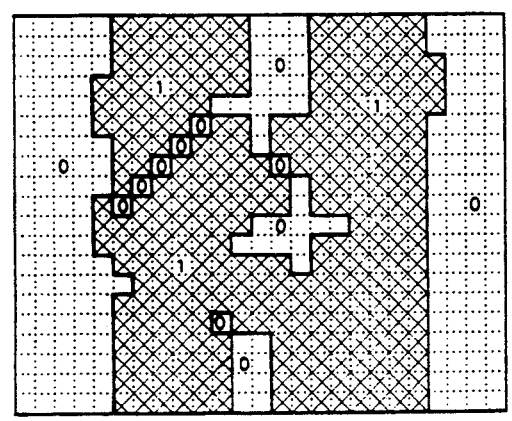
Figure 35F:
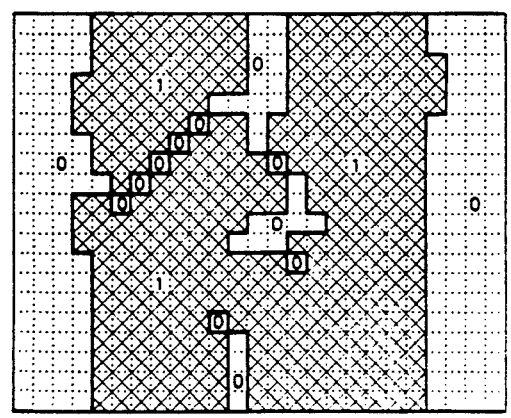
Figure 35G:
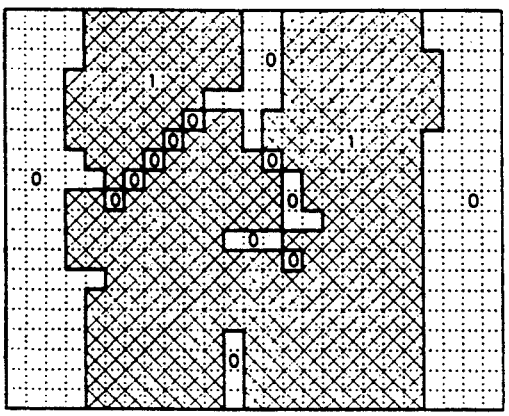
Figure 35H:
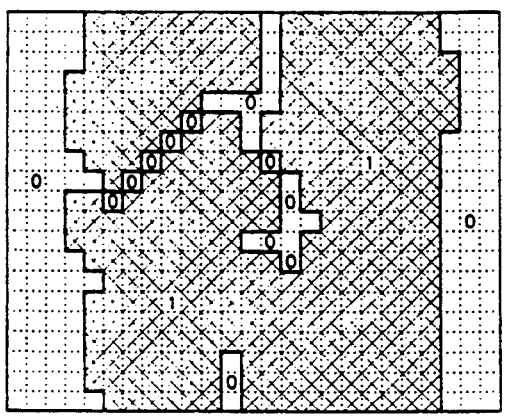
Figure 35I:
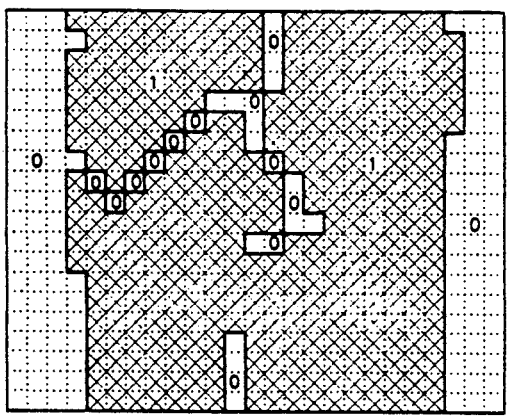
Figure 35J:
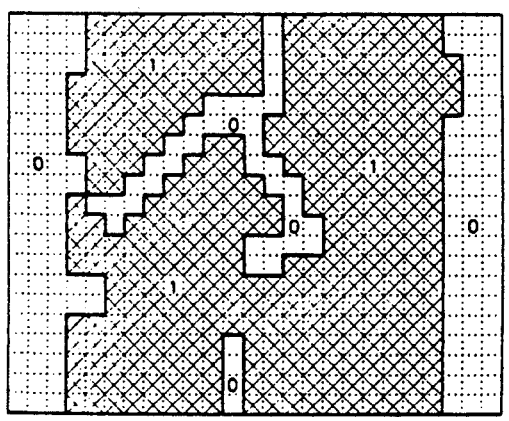
Figure 35K:
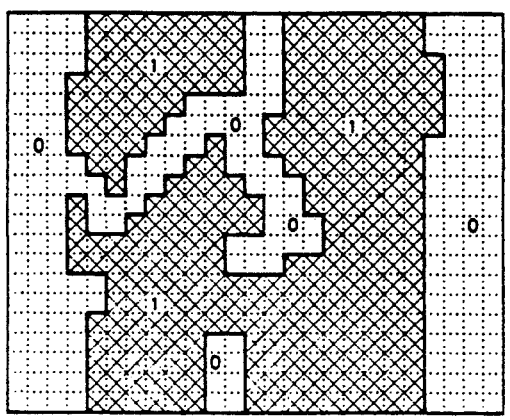
Figure 35L:
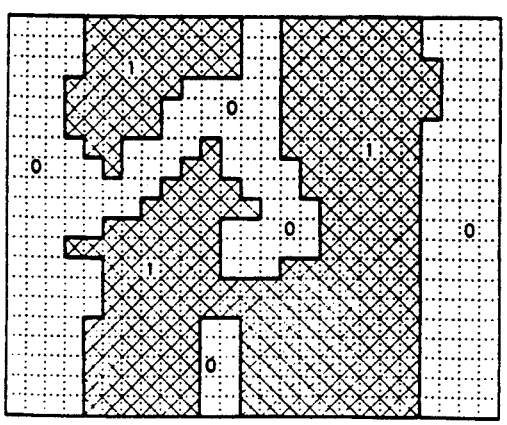
Figure 35M:
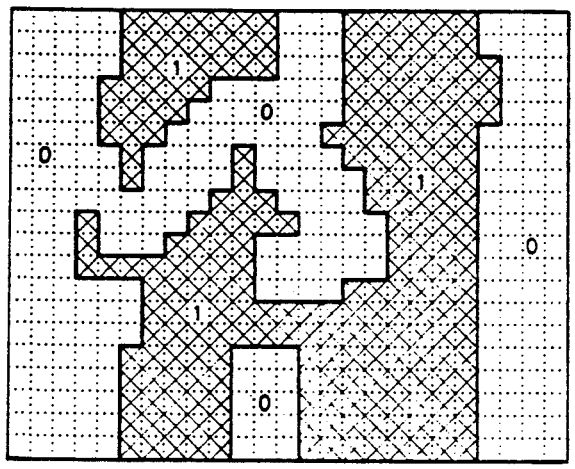
Figure 35N:
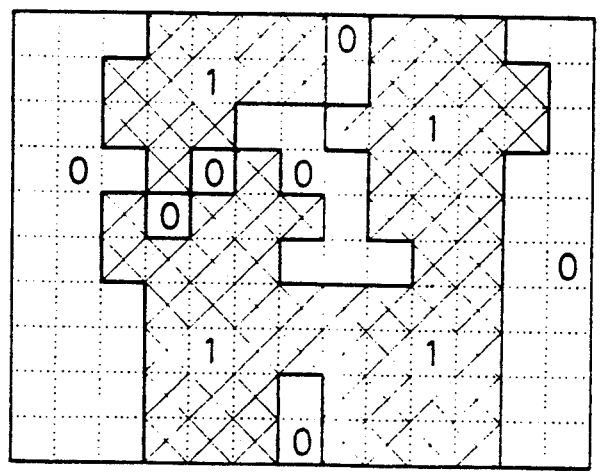

The image size reduction circuit of 209 shown in FIG. 23 performs to convert 2×2 pixels shown in FIG. 19 into one pixel and as shown in FIG. 26, this circuit can be realized by a circuit which is similar to that shown in FIG. 24. That is, the area of 2×2 pixels is cut out and its logical sum is taken by OR gate 109. Its output is latched by a latch 105n operated under a frequency of a half of a clock of an input image signal for every one line and it becomes an output signal 108.

FIG. 35 illustrates one example processed by an image processing circuit shown in FIG. 23. FIG. 35(a) illustrates an example of an input binary image 100. FIG. 35(b) illustrates a binary pattern outputted from a logic circuit 201a of the background narrowing circuit 110a, FIG. 35(c) illustrates a binary pattern outputted from a logic circuit 202a of the background narrowing circuit 110a and FIG. 35(d) illustrates a binary pattern outputted from a logic circuit 203a of the background narrowing circuit 110a. FIG. 35(e) illustrates a binary pattern outputted from a logic circuit 204a of the background narrowing circuit 110a. FIG. 35(f) illustrates a binary pattern outputted from a logic circuit 201b of the background narrowing circuit 110b, FIG. 35(g) illustrates a binary pattern outputted from a logic circuit 202b of the background narrowing circuit 110b, FIG. 35(h) illustrates a binary pattern outputted from a logic circuit 203b of the background narrowing circuit 110b and FIG. 35(i) illustrates a binary pattern outputted from a logic circuit 204b of the background 37 narrowing circuit 110b. FIG. 35(j) illustrates a binary pattern outputted from a logic circuit 205 of the pattern narrowing circuit 111, FIG. 35(k) illustrates a binary pattern of a logic circuit 206 of the pattern narrowing circuit 206, FIG. 35(l) illustrates a binary pattern outputted from a logic circuit 207 of the pattern narrowing circuit 111, and FIG. 35(m) illustrates a binary pattern outputted from a logic circuit 208 of the pattern narrowing circuit 111. FIG. 35(n) illustrates a binary pattern 101 obtained by the image size reduction processing circuit 209.

According to the example of the image size reduction circuit, an image size reduced image with a reduction rate of 2 having the pattern connectivity kept in a simple configuration is attained. Of course, if the devices of the preferred embodiment of the present invention are connected in series in number of (k), the reduced image with a reduction rate of $2^k$ can be attained.

Figure 36:
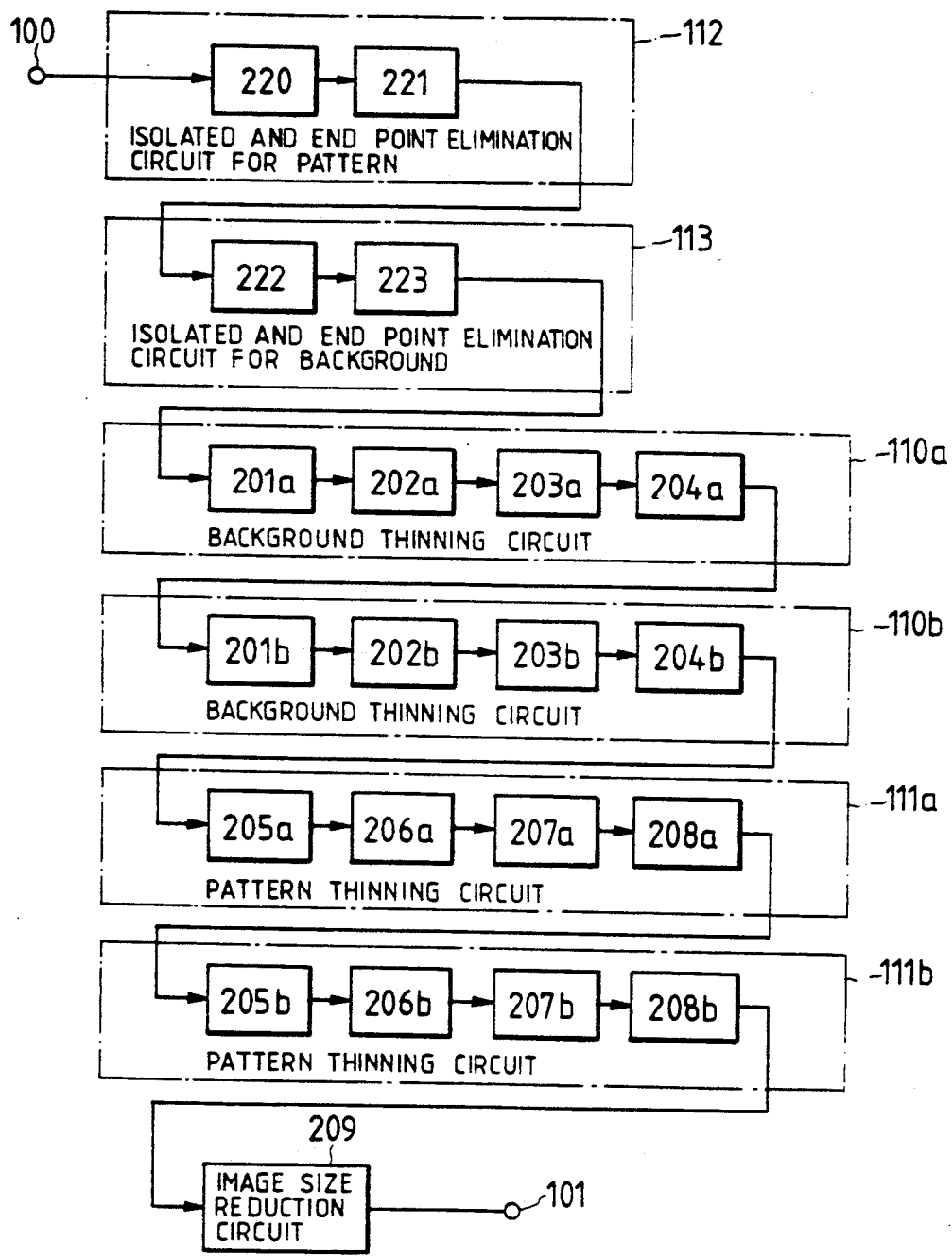

FIG. 36 illustrates a second preferred embodiment of the image size reducing circuit keeping a connectivity on the basis of a principle shown in the preferred embodiment. This practical example also has a reduction rate n=2 in the same manner as that of the first practical example.

The construction of elements 110 to 111, and 201 to 209 are quite the same as those of the first practical example. A difference in an entire configuration consists in the fact that the pattern narrowing processing circuit 111 has one more stage (111b). With this arrangement, the number of narrowing times of the background and the pattern are both two and the pattern which is gradually increased as the processing is continued can be kept at the substantial same width.

In FIG. 36, a reference numeral 112 denotes a projected and one pixel isolated point of width 1 pixel of the pattern, and a reference numeral 113 denotes a circuit for removing a projected and one pixel isolated point of width 1 pixel for the background. With these arrangements, unevennesses of the minute patterns other than the patterns noting a connectivity or patterns not influencing against the connectivity are removed. In this case, it is possible to decrease the possibility that the connectivity is varied by the preferred embodiment as illustrated in FIG. 22 and to widen the kind of pattern applicable in the preferred embodiment or a range of reduction rate (n). The order and the number of stages in 112 and 113 may be set by an applied item pattern other than that shown in the practical example.

The circuits shown at 220 to 223 in FIG. 36 are quite the same as that shown in FIG. 24. Each of the respective masks is illustrated in FIGS. 37 to 40.

It is apparent that even in the present practical example of the present invention, if the devices are connected in series in stages (k) a device with a reduction rate $2^k$ can be attained.

In the practical example of the present invention, it has an effect that a geographical variation of pattern can be restricted and the reduction rate $2^k$ can be attained in its increased value.

In case that each of the above-described preferred embodiments is connected in multi-stages, if a FIFO (First In First Out) type buffer is arranged between each of them, it is possible to input the data into the next stage with a clock of a speed of $1/n^2$ of the clock of the previous stage, so that the data speed can be decreased to $1/n^{2k}$ under a connection of k stages.

Referring now to FIGS. 55 to 60, a third preferred embodiment of the present invention will be described for its image size reduction circuit. This preferred embodiment aims to compress the image data while retaining an area in addition to a connectivity of the pattern. In this case, a reduction rate n=2 is provided. In reference to FIG. 53, its principle will be described. Area data 532 composed of N bits is provided in addition to an information of one bit for discriminating each of the pixels of binary image, i.e. a pattern and a background and the processing described below is carried out, thereby it is possible to retain an area of connected pattern with a pixel of the original image being applied as a unit even after the image size is reduced. FIG. 53 illustrates a data structure of each of the pixels in this case.

At first, as shown in FIG. 54(a), a value of each of the pixels of binary image is given as an initial value of the area data. The following processing is carried out in the same manner as that shown in the first preferred embodiment.

(Step 1): FIG. 54(b): The background is narrowed by at least $(2n-2)$ pixel in respect to a binary image portion while keeping its connectivity.

(Step 2'): FIG. 54(c):
The pattern is narrowed by at least $(n-1)$ pixel in respect to a binary image part while keeping its connectivity. At this time, as for the pattern pixel with area data being not 0, the above-described not-zero area data value is added to an area data of an adjoining pattern image and the above-described not-zero area data is zero.

(Step 3'): FIG. 54(d): As a n×n pixel unit, a logical sum of pixel of binary image is obtained and an area data value of n×n pixel is added and these values are converted into one pixel as a value of a pixel.

Also in this case, the above-described processing with the reduction rate of $n_1 \times n_2 \ldots$ is repeated, thereby it is possible to realize an image size reduction processing with a reduction rate of $n_1 \times n_2 \times \ldots$ while keeping a constant sum of area data of continuous pattern, i.e. keeping an information of area and also keeping a connectivity of the pattern.

FIG. 54 shows a value of area data in case that the pattern in FIG. 21 is processed with n=2 in each of the above (Step 1), (Step 2') and (Step 3').

An entire configuration is similar to that of FIG. 23. Its points of difference consist in that the input image signal 100 and the output image signal 101 are, as shown in FIG. 53, composed of 1 bit of binary image part and N bits of area data part and each of the element circuits 201 to 209 performs an area data retaining processing, resulting in that their circuit configurations are different from each other.

Figure 55:
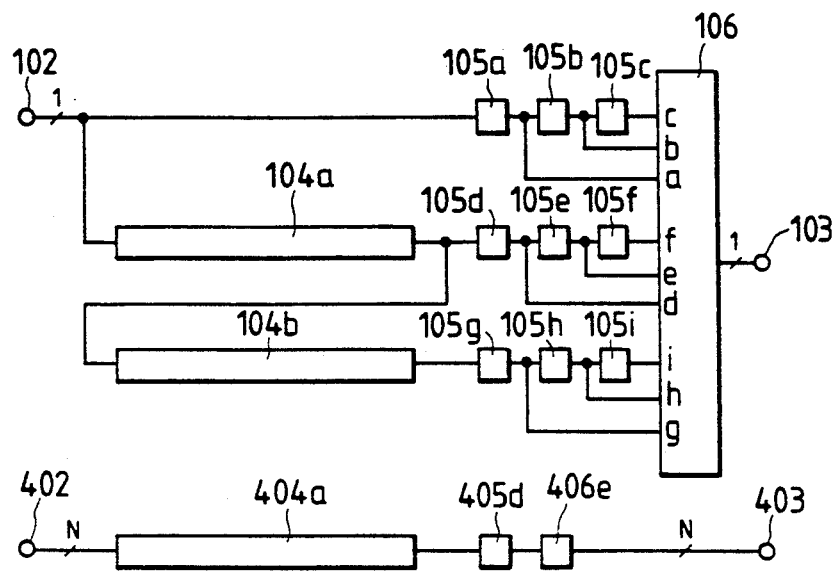
FIGS. 55 to 60 are views for illustrating a fundamental constitutional unit of the device of the present invention in case that an area is to be retained.
Figure 56:
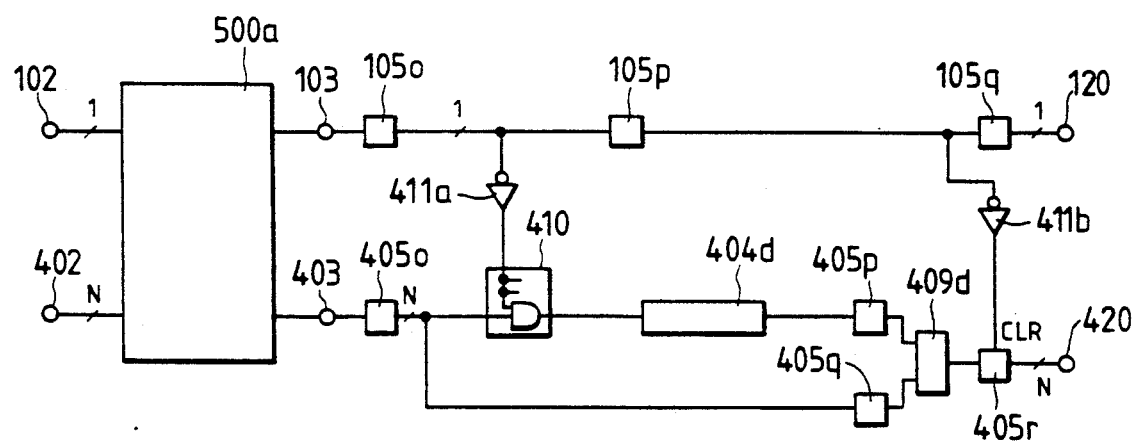
Figure 57:
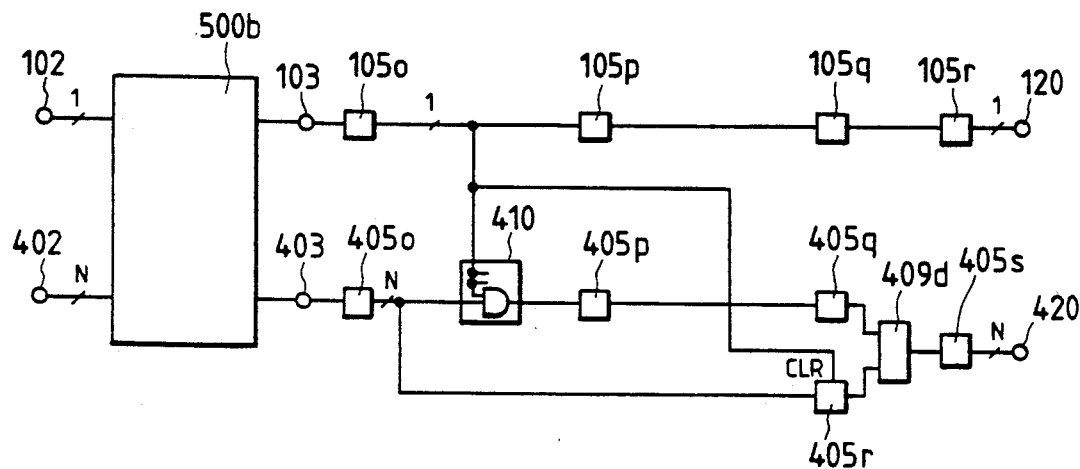
Figure 58:
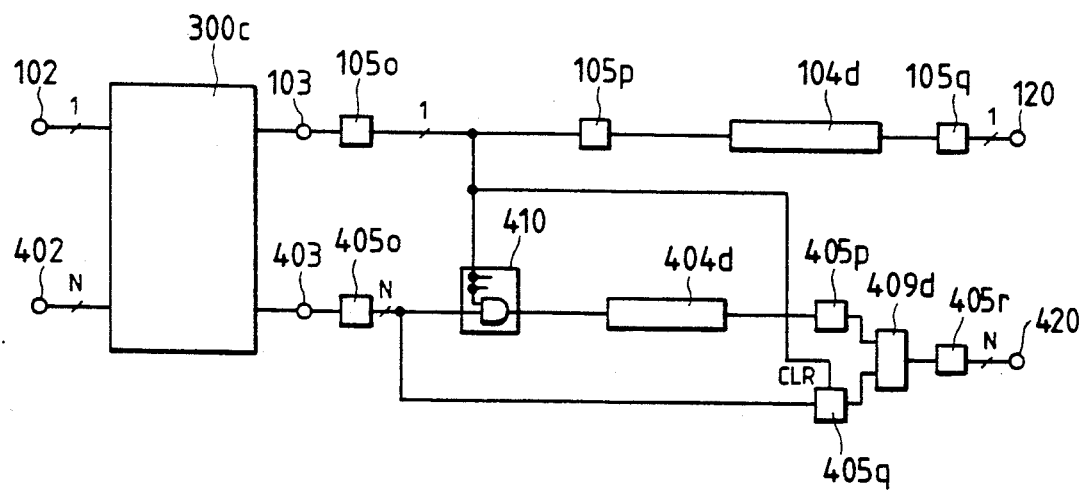
Figure 59:
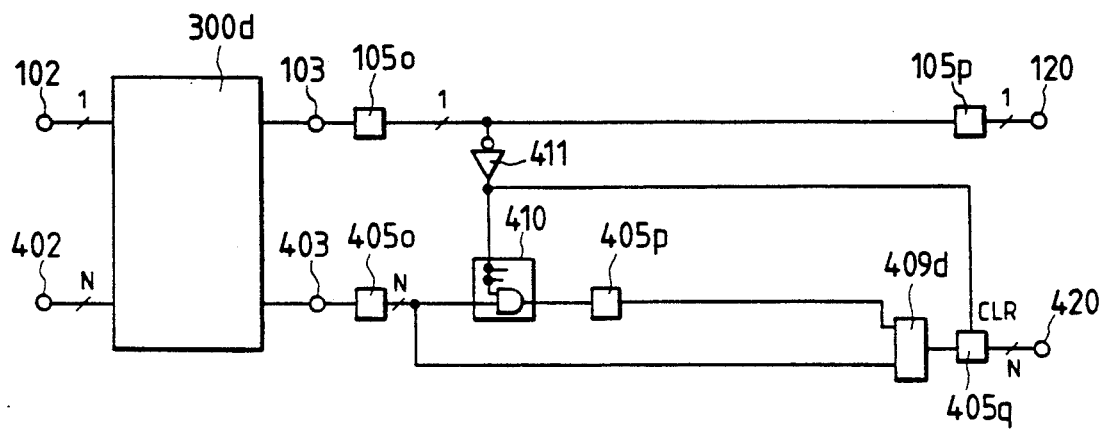

FIG. 55 shows circuits 201 to 204 of FIG. 23 with respect to another preferred embodiment of the present invention. According to each of the functions, similar to the first preferred embodiment, a combination logic circuit of 106 is selected. Also in this preferred embodiment, the combination logic in FIG. 55 corresponding to the circuits 201 to 204 corresponds to the mask shown in FIGS. 27 to 30. Within 110a and 110b of FIG. 23, an order of application of the masks 201 to 204, even if defined in any order, causes the similar effect to be attained.

In FIG. 55, a reference numeral 104 denotes a shift register of a series-input and series output type having a length of the number of pixels in a primary scanning direction of an input binary signal 102 which may act as a delay element of one line. In turn, a reference numeral 105 denotes a latch of 1 bit and a signal of 3×3 pixels shown in FIG. 25 is applied to the terminals (a) to (i) of 106. In addition, a reference numeral 402 denotes an input area data which has a width of N-bits. The same processing as that of the binary signal is applied by a shift register having the same length as that of 104 having N-bits width and by two stages of latches 405d and 405e with N-bit width and then outputted to 403. An entire circuit may be operated synchronously by a clock synchronous with a speed of input signal.

FIGS. 56 to 59 illustrate a detail of the circuits 205 to 208 of FIG. 23 in respect to this preferred embodiment of the present invention. A reference numeral 500 in this figure is the same circuit as shown in FIG. 55 and a mask of each of the combination logic circuits is made such that the mask of 500a in FIG. 56 corresponds to FIG. 31, the mask of 500b in FIG. 57 corresponds to FIG. 32, the mask of 500c in FIG. 58 corresponds to FIG. 33, and the mask of 500d in FIG. 59 corresponds to FIG. 34. In these circuits, in case that a pattern narrowing processing is carried out, an area data is added to the pattern pixel adjacent thereto and then it is zero cleared. That is, in case that a pattern coincides with each of the masks, the circuits in FIGS. 56 to 59 are operated such that each of the values of area data of pixel (e) in FIG. 25 is added to area data of pixels (b), (f), (h) and (d) and then the value of area data of the pixel (e) is set to 0. All the circuits are operated synchronously with the clock in the same manner as that of the circuit in FIG. 55. In these figures, a reference numeral 410 denotes the number N of AND gates and causes area data of N-bits to be passed as it is or to be forcedly set to 0. A reference numeral 409 denotes an adder. CLR denotes 0 clear terminal of a latch 405 of N bits in which its output is cleared in synchronous with the clock. An output binary signal 120 is delayed by the latch 105 and the shift register 104 in order to make a synchronization with an output area data signal 420. Within 111 in FIG. 23, the circuits 205 to 208 may provide a similar effect even if they are changed in any order.

Figure 60:
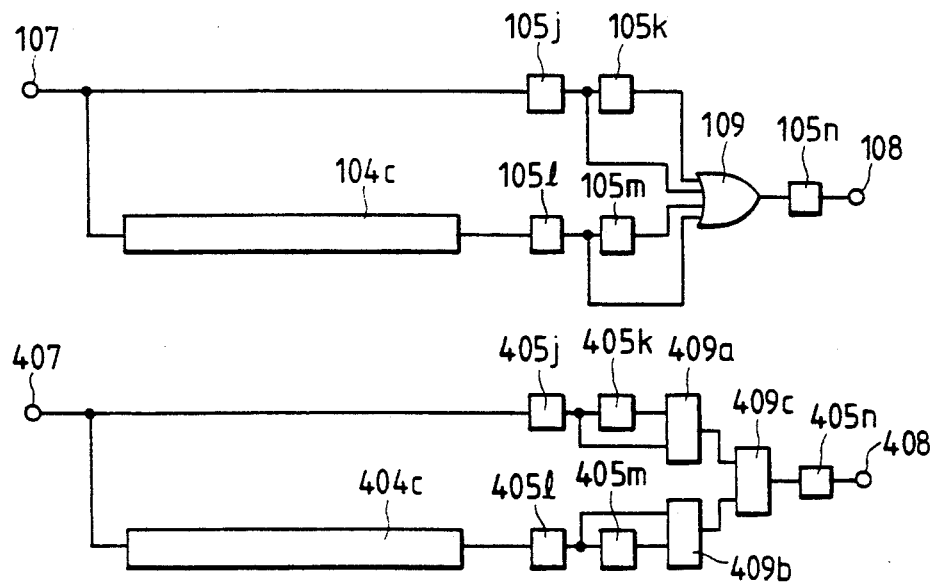

FIG. 60 shows a detailed circuit 209 of FIG. 23 with respect to the preferred embodiment of the present invention. The input binary signal 107 has quite the same constitution and effect as those of the circuit in FIG. 26 illustrated in the preferred embodiment in FIG. 23, wherein 2×2 pixels are converted into 1 pixel to output an output binary signal 108. In turn, the input area data signal 407 has N-bit width and is operated such that area data of 2×2 pixels are simultaneously cut out by the shift register 404c having a length of pixels in one line and four N-bit latches 405j, k, l and m, and then added to the adders 409a, b and c. The N-bit latch 405n may latch data for every one line with a clock of $\frac{1}{2}$ period in the same manner as that of the latch 105n and output an output area data signal 408.

In case that the device of this preferred embodiment of the present invention is applied independently or used in an initial stage of a multi-stage connection, an input signal is only a binary signal, so that it is necessary that the lower-most bit in the input area data signal has an input binary signal connected thereto and the remaining bits are made to 0.

Also in this preferred embodiment, it is apparent that the devices are connected in series in (k) stages to obtain a reduction rate of $2^k$.

The preferred embodiment of the present invention has an effect of not only a mentioning connectivity of the patterns but also capable of retaining the pattern area. It is effective in case that an excessive higher or lower pattern area becomes a defect.

If the circuits in FIGS. 55 to 60 illustrating a preferred embodiment of the present invention are applied, it is possible to constitute the fourth preferred embodiment in which an area retaining function is added to the second preferred embodiment by a method similar to the preferred embodiment of the present invention.

In case that each of the above-described preferred embodiments is connected in multi-stages, a FIFO arrangement (First In First Out) type enables the data to be inputted to the next stage with a speed clock of ¼ of the clock of previous stage, resulting in that the data speed can be reduced to ¼k under a connection of (k) stages.

Practical examples of the memories 306 and 307, the connectivity selector device 303 and the micro-computer 309 in FIG. 1 are described as follows.

The memories 306 and 307 are connected to a bus 319 of the micro-computer 309. After the entire pattern is stored in the memories 306 and 307, the content in the memories 306 and 307 are read out in sequence by the processor 308 and the connection data is generated in response to the coordinate and No. of the pads inputted from an external memory device 311 of the micro-computer 309 in advance. The connection data has a data structure practically shown in FIG. 41. The connection data VI of the reduced expanded pattern 354 becomes one shown in FIG. 41. That is, a pad No. indicating an arrow starting point of a branch of the connection data indicates an address and a pad No. indicating a terminal point becomes data. As the processor or connectivity selector 308, such a device as one processing a signal in hardware to select the connectivity or device as disclosed in the gazette of Jap. Patent Laid-Open No. 61-80376 can be applied in addition to the device for selecting the connectivity under a software processing through a normal micro-computer. The selected connection data is transmitted to the micro-computer 309, compared with a design data inputted through the external memory device 311 and then a circuit pattern having some defects can be detected.

Then, the micro-computer 309 may analyze the pattern having some defects therein at its edge in reference to the memories 306 and 307 and generate an edge coordinate sequence. A method of analyzing the edge will be described with reference to FIG. 43. In this case, it is defined that the connectivity of the pattern is four connection, i.e. it has a connection in respect to the upper, lower, right and left sides of the noted pixel. At first, the pixel is surveyed in one direction, i.e. in a rightward direction in FIG. 43 from one point in the pattern, i.e. one of the pad central positions in the pattern (mark X) 431, a point next to the point exiting out of the pattern is defined as a starting point $(x_0, y_0)$ 432. Then, according to Table 1, pixels around $(x_0, y_0)$ are surveyed in sequence and a direction struck against the pixel of the pattern for the first time is defined as a next edge point $(x_1, y_1)$ 433. In case of FIG. 43, since the survey proceeds in a direction of E (see FIG. 44) up to the starting point, so that the directions N, E and S are surveyed in this order and the pixel of pattern is found in the direction S for the first time, so that the survey is advanced to it and it is defined as an edge point $(x_1, y_1)$ 433. Then, the survey is carried out in the order of the directions E, S and W and advanced in the direction W. The above-described processing is returned back to the point $(x_0, y_0)$ 432 and this operation is repeated until the next point becomes $(x_1, y_1)$ 433.

According to the above-described processing, it is possible to get the edge coordinate sequence $(x_0, y_0)$ - $(x_1, y_1)$ ... in a clockwise direction of the pattern.

TABLE 1

| Advancing Direction in Previous Processing | Surveying Order | | | |
|---|---|---|---|---|
| | 1 | 2 | 3 | 4 |
| N | W | N | E | S |
| E | N | E | S | W |
| S | E | S | W | N |
| W | S | W | N | E |

Figure 45A:
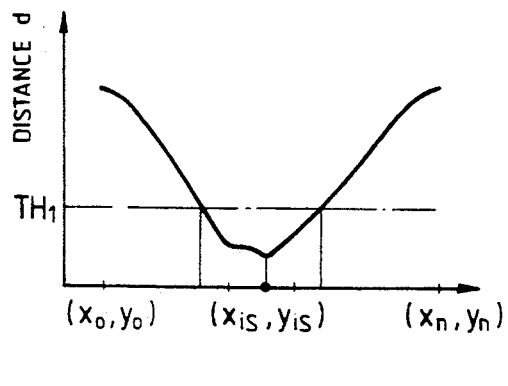
FIGS. 45(a) to 46(b) are views for illustrating a method of dividing an edge coordinate sequence, respectively.
Figure 45B:
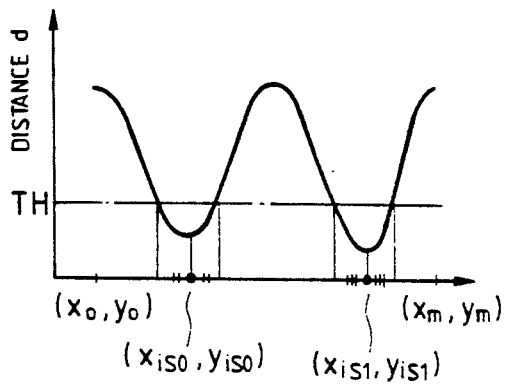
Figure 46A:
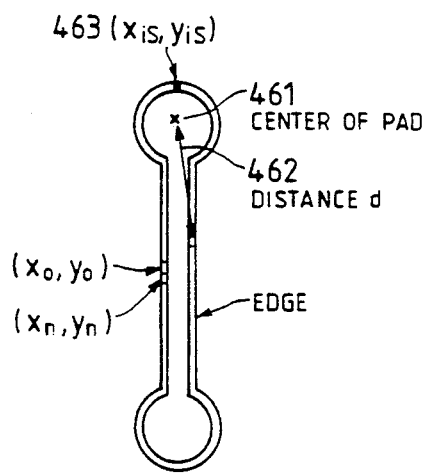
Figure 46B:
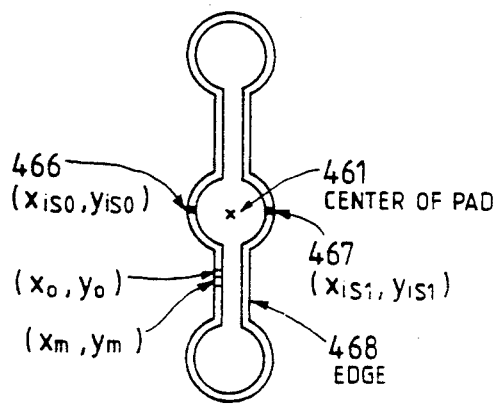

A division point as shown in FIG. 6 is searched and divided from an edge coordinate sequence got by an expansion pattern. At first, an edge coordinate distance (d) 462 is calculated in respect to a pad central position (a mark X in FIG. 46(a)) 461 in the pattern. A relation between this distance (d) and the coordinate sequence becomes a curve shown in FIG. 45(a) and an intermediate point where the distance (d) is lower than the threshold value $TH_1$ is defined as a division point $(x_{is}, y_{is})$ 463 of the edge coordinate sequence by the pad central position. As shown in FIG. 45(b) and FIG. 46(b), in case that the pad central position is not present at an end point in the pattern, it is sometimes found that it has a plurality of division points $(x_{is0}, y_{is0})$ 466 and $(x_{is1}, y_{is1})$ 467. The above-described processing to get the division point is carried out for all the pad central positions. In subsequent operation, the design data is referred to from the divided edge coordinate sequence to select the illegal edge coordinate sequence, and the position of the short (circuit) or semi-short (circuit) defect is defined by a pair of coordinates in which the minimum distance is attained between the relative edges.

The edge coordinate sequence of the pattern generating an open or semi-open (circuit) obtained from the contraction pattern is composed of at least two sequences, so that the position of the open (circuit) or semi-open (circuit) defect is defined with a pair of coordinates in which the minimum distance is attained between the relative edges.

A calculation of a distance between the pad central position and the edge point or between the edges may be performed by using $|\Delta x| + |\Delta y|$ or $\sqrt{(\Delta x)^2 + (\Delta y)^2}$ or $(\Delta x)^2 + (\Delta y)^2$, where a difference in x-coordinate is $\Delta x$ and a difference in y-coordinate is $\Delta y$. However, obtaining the value of $|\Delta x| + |\Delta y|$ causes the minimum calculation time to be attained.

According to the pattern detection method and the pattern detection apparatus of the present invention, it is possible to realize the method with the most simple constitution, so that it has an effect that a high speed pattern inspection device can be constituted with a small sized of electrical circuit.

In addition, even if any one of the several alternative systems described in the respective practical examples is combined with each other, the present method can be realized and the similar effect can be attained. Further, as also described in Jap. Patent Laid-Open No. 59-192945, in addition to (1) the defect detection caused by an expansion and a contraction, another defect can be detected through (2) an expansion and original binary pattern, (3) a contraction and original binary pattern and (4) an expansion, contraction and original binary pattern and so it is apparent that a similar preferred embodiment can be constituted by using the above-described practical examples. In particular, in case of the above item (4), it has an effect that a classification of the semi-open (circuit) and an open (circuit) and a semi-short (circuit) and a short (circuit) can be realized.

Figure 47:
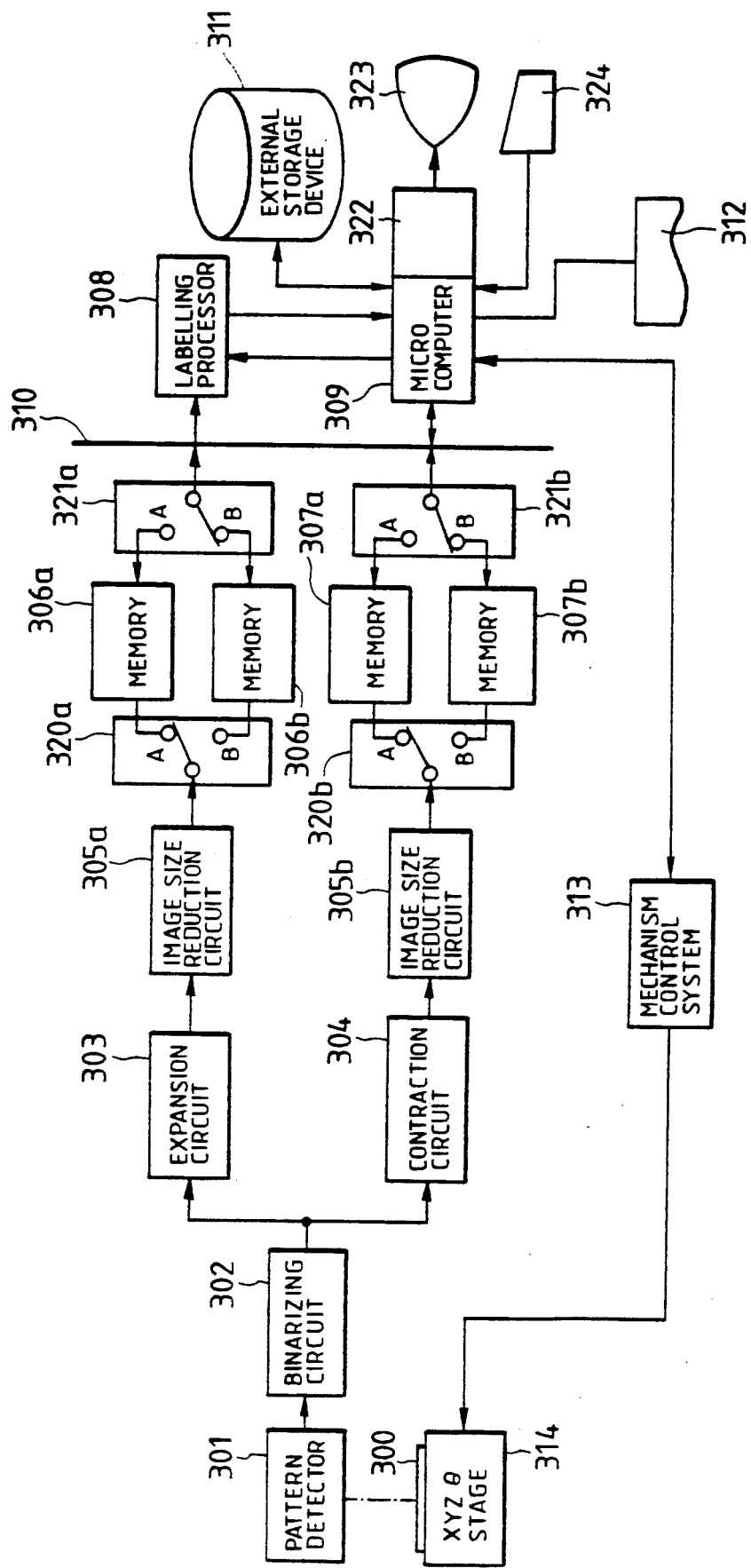
FIG. 47 is a view for showing a second preferred embodiment of the present invention.

Referring now to FIG. 47, another preferred embodiment of the present invention will be described. In the first preferred embodiment shown in FIG. 1, each of the memories 306 and 307 constitute single, separate memories. However, in the preferred embodiment of FIG. 49, the arrangement in which each of the two memories 306a and 306b, and 307a and 307b having the same configuration are changed over by using the changing-over units 320a, 320b, 321a and 321b and another arrangement in which the micro-computer 309 is provided with an image display circuit 322, a display device 323 and an input device 324 are different from the previous case. Other portions are quite the same as that of the first preferred embodiment and the practical example.

FIG. 48 illustrates a changing-over method of the changing-over units 320a, 320b, 321a and 321b and a time relation between the pattern writing memory and z processing for a connectivity selection to defect output. That is, the pattern detection, the memory writing and a processing of connectivity selection to defect output can be performed synchronously with each other. As a result, a tact time substantially becomes equal to (t), i.e. a pattern detecting time and it has an effect that the inspection time can be shortened as compared with the case in which the pattern detection to the defect output are performed in series.

Figure 49A:
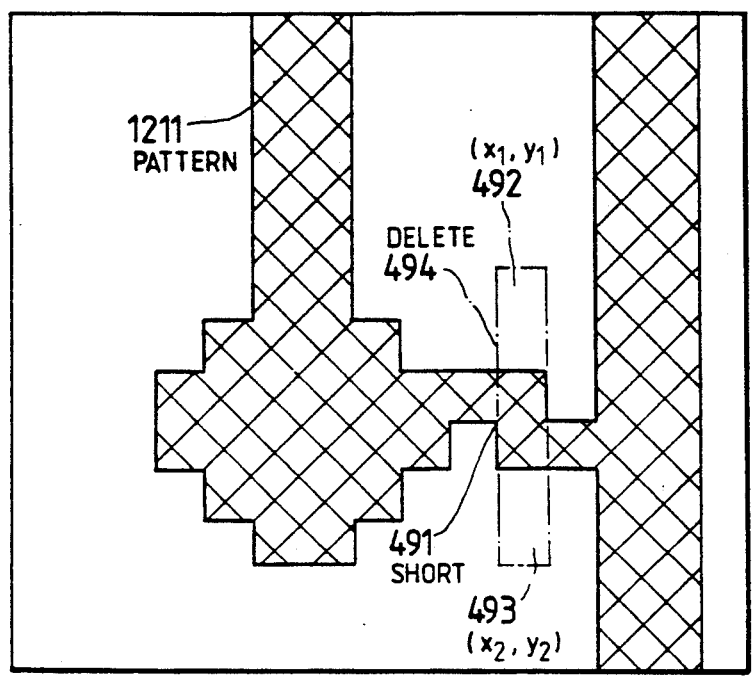
FIGS. 49(a) and (b) are views for illustrating a method for correcting a pattern on a display screen.
Figure 49B:
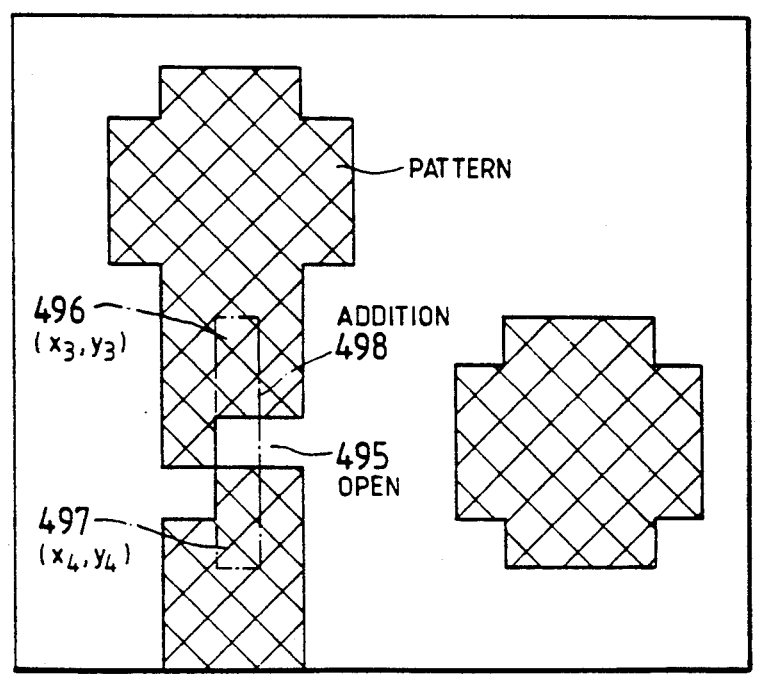
Figure 50:
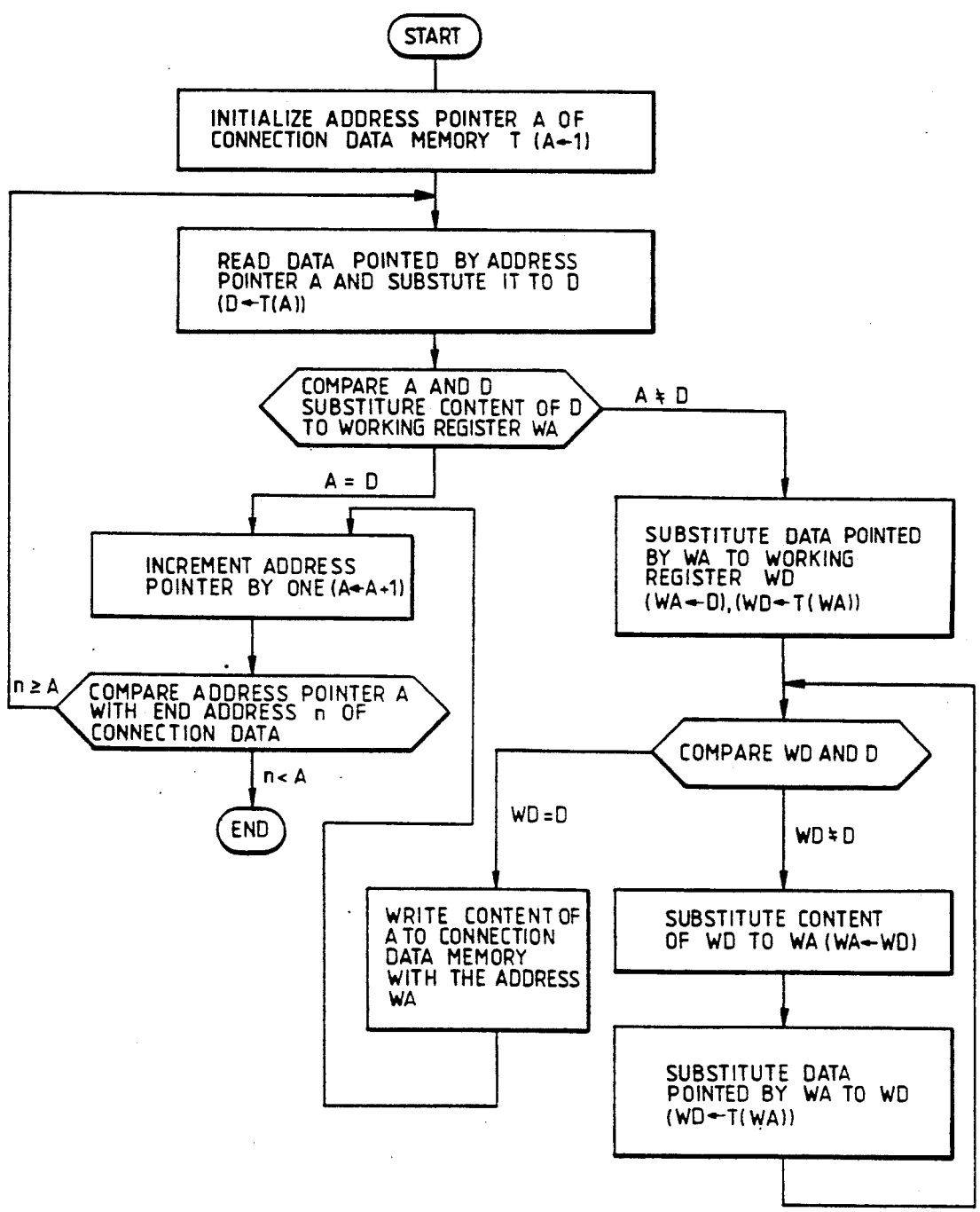
FIG. 50 is a flow chart diagram for showing a method for converting a connection data into a design data.

A method of producing a design data from an inspected item pattern according to this preferred embodiment of the present invention will be described. At first, a pattern of the inspected item acting as a reference is detected, binarized, an image size is reduced while keeping a connectivity as shown in the first preferred embodiment without performing any expansion or contraction or both of them, written into any of the memories 306a, 306b, 307a and 307b, this stored information is read out by the micro-computer 309 and then displayed on the display device 323 through an image display circuit 322. An example of a display is illustrated in FIGS. 49(a) and (b). The pattern 1211 is confirmed visually and in case that a short (circuit) 491 is found as shown in FIG. 49(a), an input device 324 is applied to specify the coordinates $(x_1, y_1)$ 492 and $(x_2, y_2)$ 493 so as to draw a background linear line on the display image, the pattern is deleted at (494) and in case that the open (circuit) 495 is found as shown in FIG. 49(b), the input device 324 is applied to specify the coordinates $(x_3, y_3)$ 496 and $(x_4, y_4)$ 497, a linear line of pattern is drawn on the display screen to add the pattern. The information of the pad central position coordinates are inputted in sequence through the input device 324 and further the pad No. (for example, automatically in the order of registration and an increased number) is applied to each of them. Under these conditions, the micro-computer 309 may perform a connectivity selecting operation in respect to the corrected display image or return the corrected display image data into any of the memories 306a, 306b, 307a and 307b, and then a connectivity selecting operation is carried out by the connectivity selecting device 308 to generate the connection data. In reference to this operation, it is converted into the design data by the micro-computer 309 on the basis of the flowchart shown in FIG. 50 and stored in the external memory device 311. In FIG. 50, T(A) denotes data of address A in the memory storing the connection data.

The design data is produced in the memory under its initial state in which the connection data is stored. As the image display circuit 322 and the display device 323, a well-known bit-map type graphic display device may be used. As the input device 324, any of the well-known input devices, such as a mouse, can be used in addition to a keyboard. In addition, a computer system such as a so-called personal computer and a work station in which the micro-computer 309, external memory device 311 and the image display circuit 322 are integrally formed may be used.

According to this preferred embodiment of the present invention, even in the case that there is no design information for use in generating a circuit pattern, it is possible to generate a design data required for inspection from the inspected item pattern and so it has an effect that it may be applied to any pattern.

Even in this preferred embodiment of the present invention, similar to the first preferred embodiment, the method of the present invention can be realized by using any combination of the alternatives described in the various practical example and a similar effect can be realized. Further, as also described in Jap. Patent Laid-Open No. 59-192945, in addition to (1) the defect detection by the expansion and contraction, the defect may be detected by (2) an expansion and original binary pattern, (3) a contraction and original binary pattern and (4) an expansion, contraction and original binary pattern and so it is apparent that the similar preferred embodiment can be constituted by applying the above-described practical example. In particular, in case of (4) above, it has an effect to enable a classification between the semi-open (circuit) and an open (circuit) and a semi-short (circuit) and a short (circuit).

According to the present invention, since the detected binary pattern is expanded and contracted and its connectivity is compared with the normal connectivity, so that even if the circuit pattern has several unevennesses at the pattern edge, it has an effect that the pattern may not be influenced by these unevennesses and only a detrimental defect will be positively detected. In addition, the connectivity selecting device stores the image once into the memory after the image size is reduced while keeping a connectivity of the pattern and so it has an effect that the connectivity selecting processing can be executed by a less-expensive device in a short period of time, resulting in that a less-expensive high speed pattern inspection device can be realized. Further, it has another effect that the analysis of a pattern shape stored in the memory is performed to enable the defect position to be specified, so that it may be applied to the pattern inspection of the high density and large sized circuit board.

What is claimed is:

1. A pattern inspecting method capable of detecting at least one defect from a group consisting of a short circuit defect, a semi-short circuit defect, an open circuit defect and a semi-open circuit defect of circuit patterns comprising the steps of:

converting an image of the circuit patterns, which have pads to which pad coordinates are given, into electrical image signals by using an image pickup device;

transforming said electrical image signal into a binary image pattern represented by binary image signals of picture elements so that said binary image pattern is formed corresponding to said circuit patterns and to a background for the circuit patterns;

expanding a space of said circuit patterns in said binary image pattern by eliminating binary image signals showing said circuit patterns at a predetermined point of said binary image pattern in relation to a narrow portion of the space of said circuit patterns, recognized on the basis of an arrangement of said circuit patterns and said background neighboring on the predetermined point of said binary image pattern while preserving the connectivity of said circuit patterns in said binary image pattern;

reducing the size of said circuit patterns of said binary image pattern by a logical processing operation operating on space-expanded circuit patterns represented by the binary image signals of picture elements, while preserving the connectivity of said circuit patterns of said binary image pattern;

examining the connectivity between said pad coordinates on said size-reduced circuit pattern; and detecting a defective circuit pattern where there is a non-coincidence when comparing the examined connectivities with reference connectivities.

2. A pattern inspecting method according to claim 1 wherein said step of expanding includes thinning the background of said binary image pattern by image-processing while preserving the connectivity of said binary image circuit pattern and thinning the circuit pattern of the background thinned binary image pattern by image processing while preserving the connectivity of said binary image circuit pattern.

3. A pattern inspection method as set forth in claim 1 in which said non-coincidence detected is analyzed to specify the positions of defect in said circuit pattern on the basis of a coordinate sequence expressing the circuit pattern having said non-coincidence.

4. A pattern inspection method as set forth in claim 1 in which said electrical image signals are detected by radiating a radiation light having a linear polarizing light in a specified direction and focusing only the reflection light having a polarizing light in a direction perpendicular to a polarizing direction of said radiation.

5. A pattern inspection method as set forth in claim 1 in which said transforming step is performed by taking a spacing secondary differentiation of a circuit pattern signal, comparing the secondary differentiating value with a threshold value TH+ ($>0$), setting it as a signal $B\bar{\gamma}2$ when more than Th+, comparing said secondary differentiating value with the threshold value Th− ($<0$), setting a signal of a part less than Th− as $B\bar{\gamma}2$, comparing the pattern signal with the threshold value Th ($\geq 0$) and setting a binarizing circuit pattern signal with $\overline{B\bar{\gamma}2}\cdot Bc + B\bar{\gamma}2\cdot\overline{Bc}$ where the signal of a part more than Th is Bc.

6. A pattern inspecting method capable of detecting at least one defect from a group consisting of a short circuit defect, an open circuit defect and a semi-open circuit defect of circuit patterns comprising the steps of:

converting an image of the circuit patterns, which have pads to which pad coordinates are given, into electrical image signals by using an image pickup device;

transforming said electrical image signals into a binary image pattern represented by binary image signals of picture elements so that said binary image pattern is formed corresponding to said circuit patterns and to background for the circuit patterns;

expanding a space of said circuit patterns in said binary image pattern by eliminating binary image signals showing said circuit patterns at a predetermined point of said binary image pattern in relation to a narrow portion of the space of said circuit patterns recognized on the basis of an arrangement of said circuit patterns and said background neighboring on the predetermined point of said binary image pattern while preserving the connectivity of said circuit patterns of said binary image pattern;

reducing the size of said circuit patterns of said binary image pattern by a logical processing operation operating on space-expanded circuit patterns represented by the binary image signals of picture elements while preserving the connectivity of said circuit patterns of said binary image pattern;

examining the connectivity between said pad coordinates on said size-reduced circuit pattern;

detecting a defect circuit pattern where there is a non-coincidence when comparing the examined connectivities with reference connectivities; and specifying the defect position in said circuit patterns on the binary image signals of the picture elements by analyzing a coordinate sequence representative of the circuit pattern detected to have the defect.

7. A pattern inspection method as set forth in claim 6 in which the coordinate sequence is an edge coordinate sequence of said circuit pattern.

8. A pattern inspection method as set forth in claim 7 in which said analyzing of the coordinate sequence is an analysis of a distance between said edge coordinate sequences.

9. A pattern inspecting method for detecting at least one defect from a group consisting of a short circuit defect, a semi-short circuit defect, an open circuit defect and a semi-open circuit defect of circuit patterns comprising the steps of:

converting an image of the circuit patterns, which have pads to which pad coordinates are given on backgrounds, into electrical image signals by using an image pickup device;

transforming said electrical image signals into a binary image pattern represented by binary image signals of picture elements so that said binary image pattern is formed corresponding to said circuit patterns and the background;

selecting a processing operation for processing said binary image pattern into a processed binary image pattern represented by the binary image signals of picture elements so as to convert a semi-short circuit pattern to a short circuit pattern;

expanding a space of said circuit patterns of the processed binary image pattern by eliminating binary image signals showing said circuit patterns at a predetermined point of said binary image pattern in relation to a narrow portion of the space of said circuit patterns recognized on the basis of an arrangement of said circuit patterns and said background neighboring on the predetermined point of said processed binary image pattern while preserving the connectivity of said processed binary image of the circuit patterns;

reducing the size of said circuit patterns of said binary pattern by a logical processing operation operating on space-expanded circuit patterns represented by the processed binary image signals of picture element preserving the connectivity of said circuit patterns of said binary image pattern;

examining the connectivity between said pad coordinates on said size-reduced circuit; and detecting whether a defect is a short circuit defect circuit pattern or an open circuit defect circuit pattern with the defect based on non-coincidence when comparing said examined connectivities with reference connectivities.

10. A pattern inspection method as set forth in claim 9 in which a contraction of an image size while preserving said connectivity is performed such that the background is narrowed by at least (2n−2) pixels (n is an integer not less than 2) while preserving its connectivity, its result is narrowed by at least (n−1) pixel while keeping a connectivity of the circuit pattern, its result is divided into n×n pixels, and when at least one pixel of these divided n×n pixels belongs to the circuit pattern, it is converted into a circuit pattern and when it does not belong to it, it is converted into one pixel as the background.

11. A pattern inspection method as set forth in claim 10 wherein n is 2.

12. A pattern inspection method as set forth in claim 11 wherein said a contraction of an image size is repeated by (k) times (k is an integer more than 2) while preserving said connectivity.

13. A pattern inspection method as set forth in claim 9 wherein the connectivity of said circuit patterns is expressed by a tree having as its root one pad No. of the pad Nos. found on the connected circuit pattern and having other pad Nos. as a leaf and the normal connectivity of the circuit pattern is made such that the pad No. to be present on the connected circuit pattern is expressed by a circulation list indicated in a loop form, a detection of non-coincidence of the connectivity and a classification and selection of the defect judges that the short (circuit) defect is present when the connection between the pads selected from said first memory is not present on said first circulation list and in case that the pads corresponding to the root of the branch expressing the connectivity between the pads selected from said second memory more than 2 are present on one circulation list, it judges that an open (circuit) defect is present.

14. A pattern inspection method as set forth in claim 9 wherein said specifying step is performed such that a contracted binary image pattern is read out in respect to the pattern having a defect from the group consisting of an open circuit and a semi-open circuit present therein, an edge coordinate sequence of said pattern is detected, and the position coordinate having said defect from the group consisting of the open circuit and the semi-open circuit present therein is set with pairs of edge coordinates with the distances between each of the points between the edge coordinate sequences being minimum.

15. A pattern inspecting method according to claim 9 wherein said step of selecting selects a processing operation for the group consisting of binary image pattern expansion and binary image pattern contraction and further comprising the step of specifying the defect position in said circuit patterns on the binary image signals of picture elements by analyzing a coordinate sequence representing contours of the circuit pattern detected to have the defect.

16. A pattern inspection method as set forth in claim 15 in which said specifying step is performed such that an expanded binary image pattern is read out in respect to the pattern having a defect from the group consisting of a short circuit and a semi-short circuit, an edge coordinate sequence of said pattern is detected, the edge coordinate sequence is divided at a point near a central coordinate of the pad present on the pattern, two edge coordinate sequences connecting the circuit patterns to be separated are selected, and the position coordinate having said defect from the group consisting of a short circuit and a semi-short circuit is defined as the pair of edge coordinates having a minimum distance between each of the edge coordinate sequences.

17. A pattern inspecting method capable of detecting at least one defect from a group consisting of a short circuit defect, a semi-short circuit defect, an open circuit defect and a semi-open circuit defect of circuit patterns comprising the steps of:

converting an image of the circuit patterns, which have pads to which pad coordinates are given, into electrical image signals by using an image pickup device;

transforming said electrical image signals into a binary image pattern represented by binary image signals of picture elements so that said binary image pattern is formed corresponding to said circuit patterns and to background for the circuit patterns;

expanding a space of said circuit patterns in said binary image pattern by eliminating binary image signals showing said circuit patterns at a predetermined point of said binary image pattern in relation to a narrow portion of the space of said circuit patterns, recognized on the basis of an arrangement of said circuit patterns and said background neighboring on the predetermined point of said binary image pattern while preserving the connectivity of said circuit patterns in said binary image pattern;

reducing the size of said circuit patterns of said binary image pattern by a logical processing operation operating on space-expanded circuit patterns represented by the binary image signals of picture elements, while preserving the connectivity of said circuit patterns of said binary image pattern;

examining the connectivity between said pad coordinates on said size-reduced circuit pattern; and detecting a circuit pattern with a defect based on non-coincidence when comparing said examined connectivities with normal reference connectivities obtained by converting an image of a normal circuit patterns having given pad coordinates, into electrical image signals by using said image pickup device.

18. A pattern inspecting apparatus for detecting at least one defect from a group consisting of a short circuit defect, a semi-short circuit defect, an open circuit defect and a semi-open circuit defect of circuit patterns comprising:

an image pickup device converting an image of the circuit patterns and a background, the patterns having pads to which pad coordinates are given, into electrical image signals;

a binarizing circuit transforming said electrical image signals into a binary image pattern represented by binary image signals of picture elements so that said binary image pattern corresponds to said circuit patterns and background;

an expanding circuit expanding a space of said circuit patterns of a binary image signal by eliminating binary image signals showing said circuit patterns at a predetermined point of said binary image pattern in relation to a narrow portion of the space of said circuit patterns recognized on the basis of an arrangement of said circuit patterns and said background neighboring on the predetermined point of said binary image pattern while preserving the connectivity of said binary image circuit pattern;

an image size production circuit reducing the size of said circuit patterns by a logical processing operation operating on space-expanded patterns represented by the binary image signals of picture elements and obtained by said expanding circuit while preserving the connectivity of said circuit patterns in binary image pattern;

means for examining the connectivity between said pad coordinates on said size-reduced circuit patterns obtained by said reduction circuit means; and means for detecting a circuit pattern with the defect based on a non-coincidence when comparing examined connectivities with reference connectivities.

19. A pattern inspecting apparatus according to claim 18 wherein said expanding circuit comprises first means for thinning the background of said binary image pattern by image-processing while preserving the connectivity of said binary image circuit pattern and second means for thinning the circuit pattern of the background thinned binary image pattern by image-processing while preserving the connectivity of said binary image circuit pattern.

20. A pattern inspection device as set forth in claim 18 in which a coordinate sequence expressing a circuit pattern is analyzed in respect to the circuit pattern having said non-coincidence detected therein to specify the position of the defect of said circuit pattern.

21. A pattern inspecting apparatus for detecting at least one defect from a group consisting of a short circuit defect, a semi-short circuit defect, and an open circuit defect and a semi-open circuit defect of circuit patterns comprising:

an image pickup device converting an image of the circuit patterns and background, the patterns having pads to which pad coordinates are given, into electrical image signals;

a binarizing circuit transforming said electrical image signals into a binary image pattern represented by binary image signals of picture elements so that said binary image pattern corresponds to said circuit patterns and background;

an expanding circuit expanding a space of said circuit patterns of a binary image signal by eliminating binary image signals showing said circuit patterns at a predetermined point of said binary image pattern in relation to a narrow portion of the space of said circuit patterns recognized on the basis of an arrangement of said circuit patterns and said background neighboring on the predetermined point of said binary image pattern while preserving the connectivity of said binary image circuit pattern;

an image size reduction circuit reducing the size of said circuit patterns by a logical processing operation operating on space-expanded patterns or backgrounds represented by the binary image signals of picture elements and obtained by said expanding circuit while preserving the connectivity of said circuit patterns in binary image pattern;

means for examining the connectivity between said pad coordinates on said size-reduced circuit patterns obtained by said reduction circuit means;

means for detecting a circuit pattern with the defect based on a non-coincidence when comparing examined connectivities with reference connectivities; and means for specifying the defect position in said circuit patterns on the binary image signals of picture elements by analyzing a coordinate sequence representative of said detected circuit pattern having the defect.

22. A pattern inspecting apparatus for detecting at least one defect from a group consisting of a short circuit defect, a semi-short circuit defect, an open circuit defect and a semi-open circuit defect of circuit patterns comprising:

an image pickup device converting an image of the circuit patterns and a background, the patterns having pads to which pad coordinates are given, into electrical image signals;

a binarizing circuit transforming said electrical image signals into a binary image pattern represented by binary image signals of picture elements so that said binary image pattern corresponds to said circuit patterns and background;

an expanding circuit expanding a space of said circuit patterns of at least one of an expanded binary image pattern and a contracted binary image pattern by eliminating binary image signals showing said circuit patterns at a prescribed point of said binary image pattern in relation to a narrow portion of the space of said circuit patterns recognized on the basis of an arrangement of said circuit patterns and said background neighboring on the prescribed point of said at least one of said expanded and contracted binary image pattern obtained by one of an expanding and contracting means while preserving the connectivity of the background neighboring on the prescribed point;

an image size reduction circuit reducing the size of said patterns by a logical processing operation operating on space-expanded circuit patterns represented and at least by one of the expanded and contracted binary image signals of picture elements and obtained by said expanding circuit while preserving the connectivity of the circuit patterns on the at least one of the expanded and contracted binary image circuit pattern;

means for examining the connectivity between said pad coordinates on said size-reduced circuit pattern obtained by said reduction circuit; and means for detecting at least one defect from a group consisting of a short circuit in a defective circuit pattern and an open circuit defect in a defective circuit pattern with the defect based on non-coincidence when comparing said examined connectivities with reference connectivities.

23. A pattern inspection apparatus as set forth in claim 22, wherein said image pickup device comprises a radiation light means having a linear polarizing light in a specified direction, a polarizing plate arranged to pass only a reflection light having a polarizing light in a direction perpendicular to a radiation polarizing direction, a lens for focusing an optical image through the polarizing plate and means for photoelectrically converting the optical image.

24. A pattern inspection apparatus as set forth in claim 22 wherein each of said expanded and contracted binary image patterns are respectively stored to a first memory and a second memory is comprised of two memories having the same constitution, and wherein changing-over units are arranged at input and output parts of said memories, and a changing-over operation is controlled in such a way that a writing of an image signal from an image size reducing means and a reading of an image signal from a connectivity examining means can be executed simultaneously from each of the memories.

25. A pattern inspecting apparatus according to claim 22 further comprising means for specifying the defect position in said circuit patterns on the binary image signals of picture elements by analyzing a coordinate sequence representative of contours of said detected circuit pattern with the defect.

26. A pattern inspecting apparatus according to claim 22 further comprising a display displaying an image of a reference detection binary circuit pattern obtained by said image pickup device and said binarizing circuit and correcting said image of the reference detection binary circuit pattern so as to remove a short circuit defect and an open circuit defect on said display image; and means for extracting said reference connectivities from a normal reference detection binary circuit corrected by said displaying means.

27. A pattern inspecting method capable of detecting at least one defect from a group consisting of a short circuit defect, a semi-short circuit defect, an open circuit defect and a semi-open circuit defect of circuit patterns comprising the steps of:
   converting an image of the circuit patterns, which have pads to which pad coordinates are given, into electrical image signals by using an image pickup device;
   transforming said electrical image signals into a binary image pattern represented by binary image signals of picture elements so that said binary image pattern is formed corresponding to said circuit patterns and to a background for the circuit patterns;
   examining the connectivity relationship between two selected points of said transformed binary image pattern on the basis of said pad coordinates;
   detecting at least one of a short circuit defect in a circuit pattern and an open circuit defect in a circuit pattern with the defect based on a non-coincidence when comparing said examined connectivities with reference connectivities; and
   specifying a position of the detected at least one of a short circuit and an open circuit defect on the basis of a minimum distance of two coordinate sequences in relation to a portion of said defect selected by analyzing coordinate sequences representative of the contours of said detected circuit pattern having the defect.

28. A pattern inspecting apparatus for detecting at least one defect from a group consisting of a short circuit defect, a semi-short circuit defect, an open circuit defect and a semi-open circuit defect of circuit patterns comprising:
   image pickup device converting an image of the circuit patterns and a background, the patterns having pads to which pad coordinates are given, into electrical image signals;
   binarizing circuit transforming said electrical image signals into a binary image pattern represented by binary image signals of picture elements so that said binary image pattern corresponds to said circuit patterns and background;
   means for examining the connectivity relationship between two selected points of said binary image pattern obtained by said binarizing circuit on the basis of said pad coordinates;
   a detector detecting at least one of a short circuit defect in a circuit pattern and an open circuit defect in a circuit pattern with the defect based on a non-coincidence when comparing said examined connectivities with reference connectivities; and
   means for specifying position of the detected at least one of a short circuit and an open circuit defect on the basis of a minimum distance of two coordinate sequences in relation to a portion of said defect selected by analyzing coordinate sequences representative of the contours of said detected circuit pattern having a defect.

29. A pattern inspecting method for detecting at least one defect from a group consisting of a short circuit defect, a semi-short circuit defect, an open circuit defect and a semi-open circuit defect of circuit patterns comprising the steps of:
   converting the circuit patterns having specific points thereof, into binary image patterns comprised of picture elements;
   thinning said binary image patterns by eliminating picture elements corresponding to an edge of said binary image patterns, while preserving the connectivity of said binary image patterns;
   reducing the size of said binary image patterns by a logical processing operation operating on at least neighboring picture elements composing said binary image patterns; and
   detecting a defective circuit pattern by detecting a non-coincidence when comparing connectivity of the size reduced binary image patterns to a reference connectivity.

30. A pattern inspecting method as set forth in claim 29, wherein said binary image patterns includes background patterns.

31. A pattern inspecting method as set forth in claim 29, further comprising:
   a step of examining a connectivity between said specific points on the size reduced binary image patterns prior to performing said detecting step.

32. A pattern inspecting apparatus for detecting at least one defect from a group consisting of a short circuit defect, a semi-short circuit defect, an open circuit defect and a semi-open circuit defect of circuit patterns comprising:
   means for converting said circuit patterns, having specific points thereof, into binary image patterns comprised of picture elements;
   means for thinning said binary image patterns, by eliminating picture elements corresponding to an edge of said binary image patterns, while preserving the connectivity of said binary image patterns;
   means for reducing the size of said binary image patterns by a logical processing operation operating on at least neighboring picture elements composing said binary image patterns; and
   means for detecting a defect circuit pattern by detecting non-coincidence when comparing said connectivity of the size reduced binary image patterns to a reference connectivity.

33. A pattern inspecting method capable of detecting at least one defect from a group consisting of a short circuit defect, a semi-short circuit defect, an open circuit defect and a semi-open defect of circuit patterns comprising the steps of:
   converting an image of the circuit patterns, which have pad to which pad coordinates are given, into electrical image signals by using an image pickup device;

transforming said electrical image signals into a binary image pattern represented by binary image signals of picture elements to that said binary image pattern is formed corresponding to said circuit patterns and to a background for the circuit patterns;

examining the connectivity relationship between two selected points of said transformed binary image pattern on the basis of said pad coordinates;

detecting at least one of a short circuit defect in a circuit pattern and an open circuit defect in a circuit pattern with the defect based on a non-coincidence when comparing said examined connectivities with reference connectivities;

detecting two edge coordinate sequences connecting the circuit patterns, on the basis of said pad coordinates of said circuit patterns; and specifying a position of said short circuit or said open circuit defect as a position where a distance between said two edge coordinate sequences in minimum.

34. A pattern inspecting apparatus for detecting at least one defect from a group consisting of a short circuit defect, a semi-short circuit defect, an open circuit defect and a semi-open circuit defect of circuit patterns, comprising:

an image pickup device converting an image of the circuit patterns and a background, the patterns having pads to which pad coordinates are given, into electrical image signals;

a binarizing circuit transforming said electrical image signals into a binary image pattern represented by binary image signals of picture elements so that said binary image pattern corresponds to said circuit patterns and background;

means for examining the connectivity relationship between two selected points of said binary image pattern obtained by said binarizing circuit on the basis of said pad coordinates;

a detector detecting at least one of a short circuit defect in a circuit pattern and an open circuit defect in a circuit pattern with the defect based on a non-coincidence when comparing said examined connectivities with reference connectivities;

means for detecting two edge coordinate sequences connecting the circuit patterns, on the basis of said pad coordinates of said circuit patterns; and means for specifying a position of said short circuit or said open circuit defect as a position where a distance between said two edge coordinate sequences is minimum.

35. A pattern inspecting apparatus for detecting at least one defect from a group consisting of a short circuit defect, a semi-short circuit defect, an open circuit defect and a semi-open circuit defect of circuit patterns comprising:

an image pickup device converting an image of the circuit patterns and a background, the patterns having pads to which pad coordinates are given, into electrical image signals;

a binarizing circuit transforming said electrical image signals into a binary image pattern represented by binary image signals of picture elements so that said binary image pattern corresponds to said circuit patterns and background;

means for modifying said binary image pattern based on one of a dilation process converting a semi-short circuit pattern to a short circuit pattern and an erosion process converting a semi-open circuit pattern to an open circuit pattern;

means for thinning said modified binary image patterns, by eliminating picture elements corresponding to an edge of said modified binary image patterns, while preserving the connectivity of said modified binary image patterns;

means for reducing the size of said thinned binary image patterns by a logical processing operation operating on at least neighboring picture elements composing said thinned binary image patterns; and means for detecting a defect circuit pattern by detecting non-coincidence when comparing said connectivity of the size reduced binary image patterns to a reference connectivity.

36. A pattern inspecting apparatus according to claim 35, wherein said image pickup device comprises a radiation light means having a linear polarizing light in a specified direction, a polarizing plate arranged to pass only a reflection light having a polarizing light in a direction perpendicular to a radiation polarizing direction, a lens for focusing an optical image through the polarizing plate and means for photoelectrically converting the optical image.

37. A pattern inspection apparatus according to claim 35, wherein each of the modified binary image patterns are respectively stored to a first memory and a second memory is comprised of two memories having the same constitution, and wherein changing-over units are arranged at input and output parts of said memories, and a changing-over operation is controlled in such a way that a writing of an image signal from an image size reducing means and a reading of an image signal from a connectivity examining means can be executed simultaneously from each of the memories.

38. A pattern inspection apparatus according to claim 35, further comprising means for specifying the defect position in said circuit patterns on the binary image signals of picture elements by analyzing a coordinate sequence representative of contours of said detected circuit pattern with the defect.

39. A pattern inspection apparatus according to claim 35, further comprising a display displaying an image of a reference detection binary circuit pattern obtained by said image pickup device and said binarizing circuit and correcting said image of the reference detection binary circuit pattern so as to remove a short circuit defect and an open circuit defect on said display image; and means for extracting said reference connectivities from a normal reference detection binary circuit corrected by said displaying means.

* * * * *

UNITED STATES PATENT AND TRADEMARK OFFICE
CERTIFICATE OF CORRECTION

PATENT NO. : 5,301,248
DATED : 5 April 1994
INVENTOR(S) : TAKANORI et al.

It is certified that error appears in the above-indentified patent and that said Letters Patent is hereby corrected as shown below:

| Column | Line | |
|---|---|---|
| 1 | 46 | Change "of" to --or--. |
| 1 | 54 | After "extraction of" insert --a--. |
| 4 | 10 | Delete "a" (both occurrences). |
| 6 | 14 | Delete "generates". |
| 6 | 15 | Change "four" to --generates four sets of-- |
| 6 | 29 | Change "$x_0°, y_0°$" to --$x_0^o, y_0^o$--; change "$x_p°, y_p°$" to --$x_p^o, y_p^o$--. |
| 7 | 23 | After "505b" insert --,--. |
| 7 | 67 | Change "unit" to --units--. |
| 8 | 6 | After "+" insert --,--; after "-" insert --,--. |

UNITED STATES PATENT AND TRADEMARK OFFICE
CERTIFICATE OF CORRECTION

PATENT NO. : 5,301,248
DATED : 5 April 1994
INVENTOR(S) : TAKANORI et al.

It is certified that error appears in the above-indentified patent and that said Letters Patent is hereby corrected as shown below:

| Column | Line | |
|---|---|---|
| 9 | 17 | Change "$B_v+2$" to --$B_v^+2$--; change "$B_v-2$" to --$B_v^-2$--. |
| 10 | 6 | Change "☐" to --[ ]--. |
| 11 | 8 | After "approaches" delete "to". |
| 11 | 30 | After "are" delete "an". |
| 13 | 64 | Delete "37". |
| 16 | 65 | Change "mentioning" to --maintaining--. |
| 18 | 55 | Delete "of". |
| 19 | 8 | Change "49" to --47--. |
| 20 | 64 | Change "signal" to --signals--. |
| 29 | 5 | Change "to" to --so--. |

Signed and Sealed this

Twentieth Day of December, 1994

Attest:

BRUCE LEHMAN

Attesting Officer     Commissioner of Patents and Trademarks